(12) United States Patent
Vukkadala et al.

(10) Patent No.: US 9,354,526 B2
(45) Date of Patent: May 31, 2016

(54) OVERLAY AND SEMICONDUCTOR PROCESS CONTROL USING A WAFER GEOMETRY METRIC

(75) Inventors: Pradeep Vukkadala, Fremont, CA (US); Sathish Veeraraghavan, Santa Clara, CA (US); Jaydeep K. Sinha, Livermore (CA)

(73) Assignee: KLA-Tencor Corporation, Milpitas, CA (US)

( * ) Notice: Subject to any disclaimer, the term of this patent is extended or adjusted under 35 U.S.C. 154(b) by 1033 days.

(21) Appl. No.: 13/476,328

(22) Filed: May 21, 2012

(65) Prior Publication Data

US 2013/0089935 A1    Apr. 11, 2013

Related U.S. Application Data

(60) Provisional application No. 61/545,942, filed on Oct. 11, 2011.

(51) Int. Cl.
| | |
|---|---|
| H01L 21/66 | (2006.01) |
| G03F 7/20 | (2006.01) |
| G01B 9/02 | (2006.01) |
| G01B 11/16 | (2006.01) |
| G01B 11/24 | (2006.01) |

(52) U.S. Cl.
CPC ........ *G03F 7/70633* (2013.01); *G01B 9/02021* (2013.01); *G01B 9/02027* (2013.01); *G01B 9/02057* (2013.01); *G01B 11/161* (2013.01); *G01B 11/2441* (2013.01); *G03F 7/70783* (2013.01); *H01L 22/12* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,605,319 B1 * | 8/2003 | Chinn | C23C 16/52 427/255.28 |
| 6,768,965 B2 * | 7/2004 | Martin | G01B 11/06 438/16 |
| 6,847,458 B2 | 1/2005 | Freischlad et al. | |

(Continued)

FOREIGN PATENT DOCUMENTS

KR    10-2011-008964 A    8/2011

OTHER PUBLICATIONS

Klaus Freischlad et al., Interferometry for Wafer Dimensional Metrology, Advanced Characterization Techniques for Optics, Semiconductors, and Nanotechnologies III, Proc. of SPIE, vol. 6672, 667202, Sep. 2007, 14 pages.

(Continued)

*Primary Examiner* — Sean Shechtman
(74) *Attorney, Agent, or Firm* — Suiter Swantz pc llo

(57) ABSTRACT

The present invention may include acquiring a wafer shape value at a plurality of points of a wafer surface at a first and second process level, generating a wafer shape change value at each of the points, generating a set of slope of shape change values at each of the points, calculating a set of process tool correctables utilizing the generated set of slope of shape change values, generating a set of slope shape change residuals (SSCRs) by calculating a slope of shape change residual value at each of the points utilizing the set of process tool correctables, defining a plurality of metric analysis regions distributed across the surface, and then generating one or more residual slope shape change metrics for each metric analysis region based on one or more SSCRs within each metric analysis region.

37 Claims, 16 Drawing Sheets

(56) References Cited

U.S. PATENT DOCUMENTS

| | | |
|---|---|---|
| 7,209,857 B2 | 4/2007 | Sato et al. |
| 7,415,319 B2 | 8/2008 | Werkman et al. |
| 7,643,130 B2 | 1/2010 | Yoshitake |
| 7,876,438 B2 | 1/2011 | Ghinovker et al. |
| 8,065,109 B2 | 11/2011 | Veeraraghavan et al. |
| 8,068,234 B2 | 11/2011 | Tang et al. |
| 2004/0184038 A1 | 9/2004 | Freischlad et al. |
| 2007/0103659 A1 | 5/2007 | Yoshitake et al. |
| 2008/0316442 A1 | 12/2008 | Adel et al. |
| 2009/0259431 A1 | 10/2009 | Yoshitake |
| 2011/0144943 A1 | 6/2011 | Veeraraghavan et al. |
| 2011/0172982 A1 | 7/2011 | Veeraraghavan et al. |

OTHER PUBLICATIONS

Kevin T. Turner et al., Predicting distortions and overlay errors due to wafer deformation during chucking on lithography scanners, J. Micro/Nanolith. MEMS MOEMS vol. 8(4), 043015 (Oct.-Dec. 2009), © 2009 SPIE, 8 pages.

* cited by examiner

OVERLAY AND SEMICONDUCTOR PROCESS CONTROL USING A WAFER GEOMETRY METRIC

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of U.S. Provisional Patent Application entitled OVERLAY AND SEMICONDUCTOR PROCESS CONTROL USING A NOVEL WAFER GEOMETRY METRIC, naming Sathish Veeraraghavan, Pradeep Vukkadala, and Jaydeep K. Sinha as inventor, filed Oct. 11, 2011, Application Ser. No. 61/545,942.

TECHNICAL FIELD

The present invention generally relates to a method and system for providing a wafer geometry metric, and, a method and system for providing a wafer geometry metric suitable for allowing improved overlay and process control during semiconductor fabrication.

BACKGROUND

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), rapid thermal processing (RTP), etching, deposition, and ion implantation. Multiple semiconductor devices may be fabricated in an arrangement on a single semiconductor wafer and then separated into individual semiconductor devices.

Due to the ever shrinking integrated circuit node sizes, the characterization of semiconductor wafer geometry has become increasingly important. Wafer geometry has traditionally been classified with parameters that vary at low frequency across a given wafer. Such characteristics may include shape and/or flatness. Shape is typically defined as the deviation of the median surface of a wafer from a reference plane, and is quantified using a global metric, such as warp or bow. Flatness is defined as the thickness variation of a substrate with the back surface assumed to be completely flat, and is characterized by site-based metrics such as SFQR (site front surface least square fit plane range).

Shape characterization is performed using methods that measure large variations across an entire surface of a wafer. In addition to the low frequency components of wafer shape it is advantageous to quantify the higher order components of shape, which are limited to localized regions of the substrate, and generally cannot be characteristic satisfactorily using a global shape metric, such as warp and bow. With increased demand on defocus and overlay budgets, the importance of high order shape characterization continues to increase. In addition, the application of semiconductor processes to a wafer may impact wafer topography, such as wafer shape. These changes in wafer shape lead to in-plane as well as out-of-plane distortions of the wafer.

An overlay measurement generally specifies how accurately a first patterned layer aligns with respect to a second patterned layer disposed above or below it or how accurately a first pattern aligns with respect to a second pattern disposed on the same layer. Overlay error is traditionally determined with an overlay target having structures formed on one or more layers of a semiconductor wafer. If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of semiconductor integrated circuit manufacturing.

The in-plane distortions created by changes in wafer shape result in a misregistration between features in sequential patterning steps, which are manifest in measured overlay error between the patterned layers. As such, there is a need for improved wafer shape and wafer shape change characterization. As such, it is advantageous to provide a method and system that remedies these identified deficiencies.

SUMMARY

A method for providing a wafer geometry metric is disclosed. In one aspect, a method may include, but is not limited to, acquiring a wafer shape value at each of a plurality of points of a surface of a wafer at a first process level and an additional process level; generating a wafer shape change value at each of the points utilizing the acquired wafer shape value at each of the points at the first process level and the additional process level, the wafer shape change value at each point corresponding to a change in wafer shape between the first process level and the second process level; generating a set of slope of shape change values by calculating a slope of shape change at each of the points utilizing the generated wafer shape change value at each of the points, each of the slope of shape change values corresponding to a slope of the change in wafer shape along at least one direction of the surface of the wafer; calculating a set of process tool correctables utilizing the generated set of slope of shape change values; generating a set of slope shape change residuals (SSCRs) by calculating a slope of shape change residual value at each of the points utilizing the set of process tool correctables; defining a plurality of metric analysis regions distributed across the surface of the wafer, each metric analysis region encompassing one or more points of the plurality of points; and generating one or more residual slope shape change metrics for each metric analysis region based on one or more SSCRs within each metric analysis region.

In another aspect, a method may include, but is not limited to, acquiring a wafer shape value at each of a plurality of points of a surface of the wafer at a process level; generating a set of slope of shape values by calculating a slope of shape value at each of the points at the process level utilizing the wafer shape values acquired at the process level; calculating a set of process tool correctables utilizing the generated set of slope of shape values; generating a set of slope shape residuals (SSRs) by calculating a slope of shape residual value at each of the points utilizing the set of process tool correctables; defining a plurality of metric analysis regions distributed across the surface of the substrate, each metric analysis region encompassing one or more points of the plurality of points; and generating one or more residual slope shape metrics for each metric analysis region based on one or more SSRs within each metric analysis region.

A method for sorting wafers utilizing a slope of shape metric is disclosed. The method may include, but is not limited to, receiving a plurality of wafers; acquiring a set of wafer shape values from a surface of each wafer at a selected process level; generating a set of residual slope shape metrics for each wafer by calculating a residual slope shape metric at each of a plurality of points of each wafer; determining a neutral surface of each wafer in a chucked state; calculating a neutral surface factor (NSF) for each wafer utilizing the determined neutral surface for each wafer and a plurality of positions associated with a plurality of patterns of each wafer; determining a set of pattern placement error (PPE) residual values for each wafer, the PPE residual value for each point for each wafer being a product of at least the calculated NSF for each wafer, the residual slope shape metric for the point, and a thickness of the wafer; determining one or more thresholds for the set of residual shape metrics suitable for maintaining the set of PPE residuals below one or more selected levels; and characterizing the plurality of wafers by comparing the determined one or more thresholds for the set of residual shape metrics to the generated set of residual slope shape metrics for each wafer.

A method for process uniformity control is disclosed. The method may include, but is not limited to, acquiring a wafer shape value at each of a plurality of points of a surface of a wafer at a first process level and an additional process level; generating a wafer shape change value at each of the points utilizing the acquired wafer shape value at each of the points at the first process level and the additional process level, the wafer shape change value at each point corresponding to a change in wafer shape between the first process level and the second process level; generating one or more residual slope shape change metrics utilizing the generated wafer shape change value at each of the points; and providing process control to one or more process tools based on the generated one or more residual slope shape change metrics.

A method for overlay control is disclosed. The method may include, but is not limited to, acquiring a wafer shape value at each of a plurality of points of a surface of a wafer at a first process level and an additional process level; generating a set of wafer shape change values by calculating a wafer shape change value at each of the points utilizing the acquired wafer shape value at each of the points at the first process level and the additional process level; generating a set of slope shape change residuals utilizing the generated wafer shape change value at each of the points; calculating a set of residual slope shape change metrics utilizing the set of sloe shape change residuals; acquiring a set of overlay values at a plurality of points on the surface of the wafer at the additional process level, the set of overlay values associated with a misalignment produced between the first process level and the additional process level; generating a set of overlay residuals utilizing the acquired set of overlay values; calculating a set of overlay residual metrics utilizing the set of overlay residuals; generating a calibration curve by comparing the set of residual slope shape change metrics to the set of residual overlay metrics; and determining a threshold for the set of residual slope shape change metrics suitable for maintaining residual overlay below a selected level based on the generated calibration curve.

A system for providing a wafer geometry metric is disclosed. In one aspect, a system may include, but is not limited to, a topography system configured to perform a set of topography measurements in order to acquire a wafer shape value at each of a plurality of points of a surface of a wafer at a first process level and an additional process level; and one or more computing systems communicatively coupled to the topography and configured to receive the set of topography measurements, the one or more computing systems further configured to: generate a wafer shape change value at each of the points utilizing the acquired wafer shape value at each of the points at the first process level and the additional process level; generate a set of slope of shape change values by calculating a slope of shape change at each of the points utilizing the generated wafer shape change value at each of the points; calculating a set of process tool correctables utilizing the generated set of slope of shape change values; generating a set of slope shape change residuals (SSCRs) by calculating a slope of shape change residual value at each of the points utilizing the set of process tool correctables; defining a plurality of metric analysis regions distributed across the surface of the substrate; and generating one or more residual slope shape change metrics for each metric analysis region based on one or more SSCRs within each metric analysis region.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1:
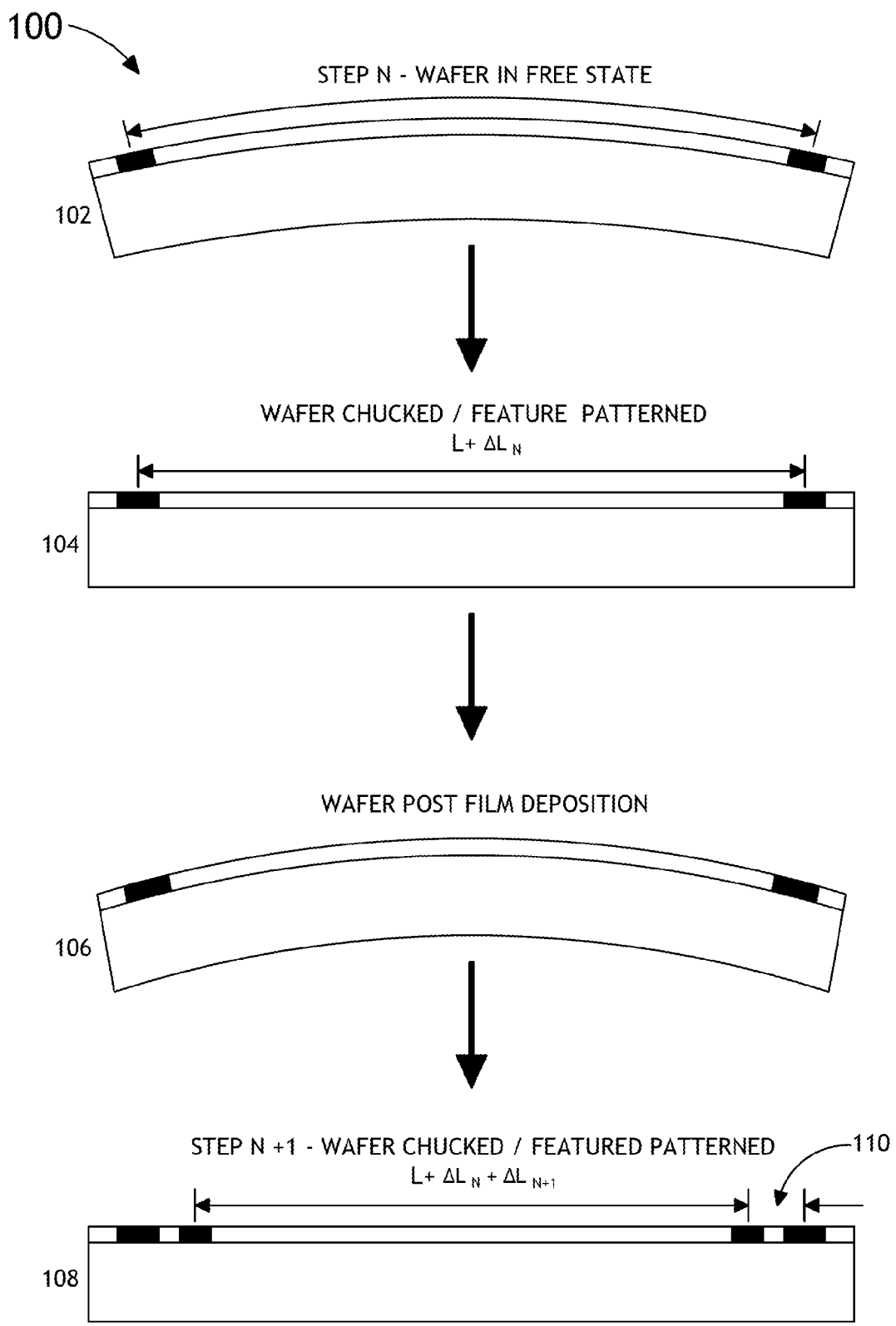
FIG. 1 illustrates a conceptual view of wafer shape change induced overlay error, in accordance with the present invention.

Reference will now be made in detail to the subject matter disclosed, which is illustrated in the accompanying drawings.

Referring generally to FIGS. 1A through 12, a system and method for providing a wafer geometry metric is described in accordance with the present disclosure. The present invention is directed to a method and system for providing one or more wafer geometry metrics derived from wafer shape data acquired using a semiconductor wafer topography technique (e.g., Fizeau interferometry). In this regard, the various embodiments of the present invention may act to quantify wafer shape at a selected process level or the change in wafer shape between a first process level (e.g., bare ware level) and an additional process level. In one aspect, the present invention may utilize these wafer shape measurements to provide a set of "slope of wafer shape change" data. In an alternative aspect, the present invention may also provide a set of "slope of shape" data, derived from wafer shape measurements. Utilizing the slope of wafer shape change (referred to herein as "slope shape change") data and/or the slope of shape (referred to herein as "slope shape") data along with one or more process tool correctables routines, a variety of geometry wafer metrics may be generated. The generated wafer metrics may in turn be used to provide a number of improved fabrication and process control techniques. The present invention is further directed to i) a method and system for sorting wafers; ii) a method and system for process uniformity control; and iii) a method and system for overlay control.

As used throughout the present disclosure, the term "wafer" generally refers to a substrate formed of a semiconductor or non-semiconductor material. For example, a semiconductor or non-semiconductor material may include, but is not limited to, monocrystalline silicon, gallium arsenide, and indium phosphide. A wafer may include one or more layers. For instance, such layers may include, but are not limited to, a resist, a dielectric material, a conductive material, and a semiconductive material. Many different types of such layers are known in the art, and the term wafer as used herein is intended to encompass a wafer on which all types of such layers may be formed.

A typical semiconductor process includes wafer processing by lot. As used herein a "lot" is a group of wafers (e.g., group of 25 wafers) which are processed together. Each wafer in the lot is comprised of many exposure fields from the lithography processing tools (e.g. steppers, scanners, etc.). Within each field may exist multiple die. A die is the functional unit which eventually becomes a single chip. One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Throughout the present disclosure, "shape" is defined as the median surface of a wafer (or substrate) as generally measured in a free state. Typically, shape is characterized by a global metric, such as warp or bow. In addition, higher order components of shape may be calculated. Higher order components of wafer shape, which are associated with localized areas of the wafer, typically, do not impact global shape metrics. Higher order shape (HOS) may be quantified utilizing a shape-slope metric, which is a measure of the change of the shape as a function of position across the wafer. The utilization of shape-slope to measure high order shape is discussed in detail in U.S. Pat. No. 8,065,109 by Veeraraghavan et al., entitled Localized Substrate Geometry Characterization, issued on Nov. 22, 2011, which is incorporated herein by reference.

FIG. 1 illustrates a conceptual view of wafer shape distortion induced overlay error. Wafer shape change resulting from wafer processing and/or wafer chucking may induce in-plane distortions (IPD) within the wafer, which may lead to overlay error between a first patterning step (N) and a subsequent patterning step (N+1). It should be recognized by those skilled in the art that a wafer chucking procedure may act to flatten the back-side of the wafer, as shown between step 102 and 104 of FIG. 1, resulting in the which results in bending and shear deformation of the wafer. It is noted herein that wafer processing may include any wafer processing technique known in the art, such as, but not limited to, CMP, RTP, etching, and film deposition. As shown in FIG. 1, an initial wafer may be received in a free state at patterning step N (step 102). In the initial free state, the wafer may have a characteristic length between a set of patterns of L. Then, the wafer may be chucked and features may be patterned on the wafer (step 104). The chucking and patterning step N produce a change in the characteristic length of $\Delta L_N$. This results in an overall length between the patterned features of $L+\Delta L_N$. Then, the wafer may undergo a post film deposition process (step 106), which may act to change the shape of the wafer. Next, the wafer may undergo a subsequent patterning step N+1 while in a chucked state (step 108). The second chucking and N+1 patterning step may produce an additional change in characteristic length of $\Delta L_{N+1}$, yielding an overall length of $L+\Delta L_N+\Delta L_{N+1}$. Due to the wafer shape change that occurs between steps N and N+1, the elastic distortion of the wafer that occurs during chucking in patterning step N is different from the distortion that occurs during chucking in patterning step N+1. The corresponding difference in in-plane distortions during chucking at the different steps may then manifest as overlay errors between the N and N+1 patterns. The relationship between wafer shape change and overlay error is described in detail in K. Turner et al, "*Predicting Distortions and Overlay Errors Due to Wafer Deformation During Chucking on Lithography Scanners*", J. Micro/Nanolith, MEMS MOEMS 8(4), 043015, (October-December 2009), which is incorporated in the entirety herein by reference. In addition, chucking induced wafer shape change and in-plane distortions are described generally in U.S. patent application Ser. No. 12/778,013 by Veeraraghavan et al., entitled Site Based Quantification of Substrate Topography and Its Relation to Lithography Defocus and Overlay, filed on May 11, 2010, which is incorporated in the entirety herein by reference.

Figure 2A:
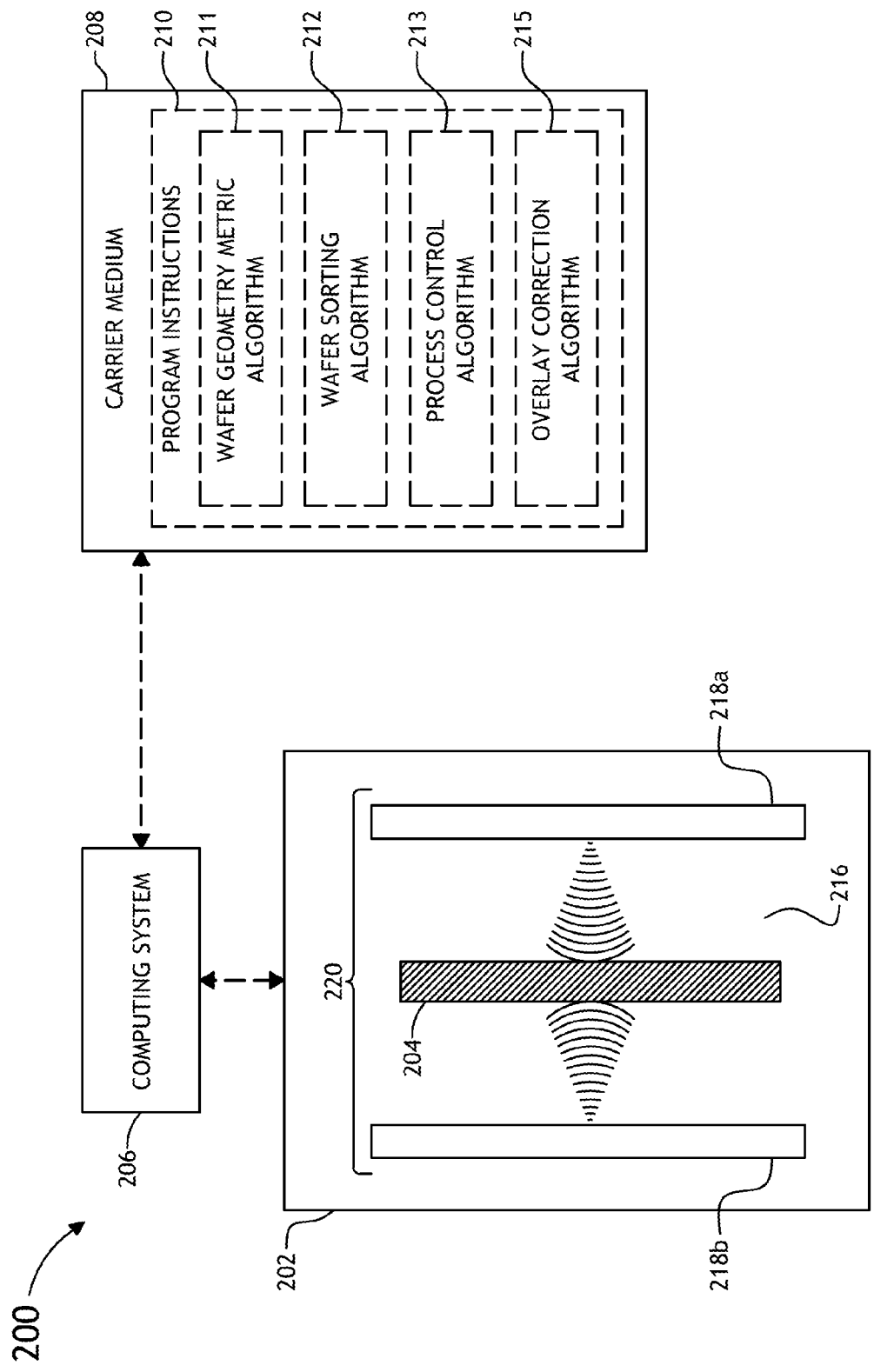
FIG. 2A illustrates a block diagram view of a system for providing a wafer metric, in accordance with the present invention.
Figure 2B:
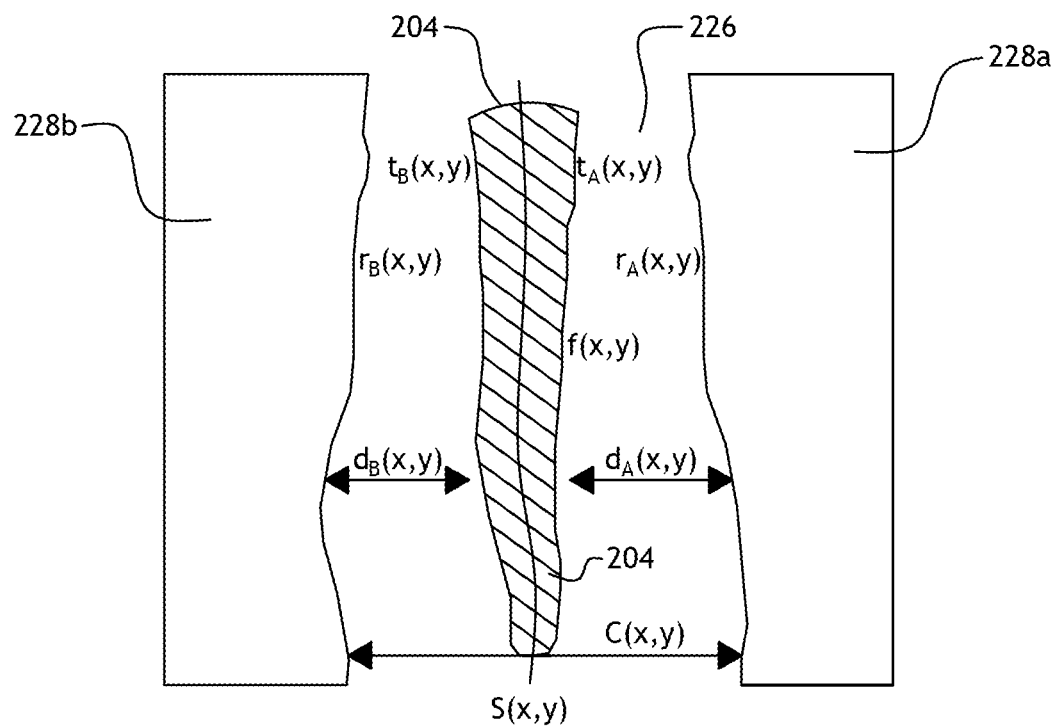
FIG. 2B illustrates a schematic view of dual Fizeau cavity of a dual Fizeau interferometer, in accordance with the present invention.

FIGS. 2A-2B illustrate a system 200 for providing a wafer geometry metric, in accordance with one embodiment of the present invention. In one aspect, the system 200 may include a topography measurement system 202 configured to perform one or more topographic measurements of a wafer 204. In one embodiment, the topography measurement system 202 may include a Dual Fizeau interferometer 220 suitable for simultaneously measuring topography of the front-side of the wafer 204 and the back-side of the wafer 204. In another aspect, the system 200 may include one or more computing systems 206 communicatively coupled to the topographic measurement system 202 and configured to receive topography measurements from the measurement system 202.

FIG. 2B illustrates a conceptual view of a Dual Fizeau cavity in accordance with the present invention. As shown in FIG. 2B, the Dual Fizeau cavity may be configured to hold the wafer 204 in a substantially vertical position. For instance, the Dual Fizeau cavity 216 many include a set of point contact devices (not shown) configured to receive and hold the wafer in a substantially upright position in a substantially free state. Utilizing the two reference flats 218a and 218b, which serve as the reference surfaces for the interferometer, the Dual Fizeau interferometer may analyze various parameters associated with the wafer 204 and its spatial relationship to the reference flats 218a and 218b.

Utilizing the Dual Fizeau interferometer 220, the topography system 202 may simultaneously measure height variations of both the front-side surface and back-side surface of the wafer 204. The shape value at each of the measured points of the front-side and/or back-side surface may then be calculated utilizing the measured height variation at those points. The shape, s(x,y), of the wafer as a function of X-Y position on the surface of the wafer may be expressed as:

$$s(x, y) \approx \frac{1}{2}(d_A(x, y) - d_B(x, y)) - \text{Tilt} \quad \text{(Eq. 1)}$$

where $d_A(x,y)$ represents the cavity distance between the reference flat A 228a of cavity 226 and a first side 230 (e.g., front-side) of the wafer, $d_B(x,y)$ represents the cavity distance between the reference flat B 228b of cavity 226 and a second side 232 (e.g., back-side) of the wafer, Tilt represents the tilt of the wafer 202 within the Dual Fizeau cavity 226. Utilizing the relationship of Eq. 1 a two-dimensional X-Y map of shape may be constructed by calculating shape at a plurality of positions on the wafer 204. For example, a shape map having a lateral resolution of approximately 500 µm may be constructed utilizing the height variation measurements acquired with the interferometry system 220 and the corresponding shape value at each of the measured points on the wafer. In a further embodiment, the one or more computing systems 206 may execute a preprogrammed algorithm configured to compute shape at the plurality of selected measurement points by applying a shape calculating algorithm (e.g., equation 1) to interferometry data received from the topography system 202. Dual Fizeau interferometry suitable for measuring front-side and back-side topography of a wafer is described in detail in Klaus Freischlad et al., "*Interferometry for Wafer Dimensional Metrology*", Proc. SPIE 6672, 1 (2007), which is incorporated in the entirety herein by reference. In addition, Dual sided interferometry is described generally in U.S. Pat. No. 6,847,458 by Freischlad et al., entitled Method and Apparatus for Measuring the Sahpe and Thickness Variation of Polished Opaque Plates, issued on Jan. 25, 2005, U.S. Pat. No. 8,068,234 by Tang et al., entitled Method and Apparatus for Measuring Shape or Thickness Information of a Substrate, issued on Nov. 29, 2011, which are both incorporated in the entirety herein by reference.

In a further embodiment, the topography system 202 may be configured to accept instructions from another subsystem of the system 200 in order to carry out a designated measurement scheme. For instance, the topography system 202 may accept instructions from one or more computing systems 206 of the system 200. Upon receiving the instructions from the computing system 206, the topography system 202 may perform topographic measurements (i.e., wafer geometry measurements) at various locations, or points, across one or more surfaces (e.g., front-side surface or back-side surface) of the semiconductor wafer 204 identified in the provided instructions.

In another aspect, the one or more computing systems 206 may be configured to receive a set of measurements performed by the topography system 202 in a sampling process of one or more wafers of a lot. Upon receiving results of the one or more sampling process from the topography system 202, the one or more computing systems 206 may then generate one or more wafer geometry metrics (e.g., slope shape change metric or slope shape metric) via a preprogrammed wafer geometry metric algorithm 211, discussed further herein. In additional embodiments, the system 200 may utilize the geometry metric for a variety of process control features. For example, the system 200 may further be configured to execute a wafer sorting algorithm 212, a process control algorithm 213, and/or an overlay correction algorithm 215.

Figure 3A:
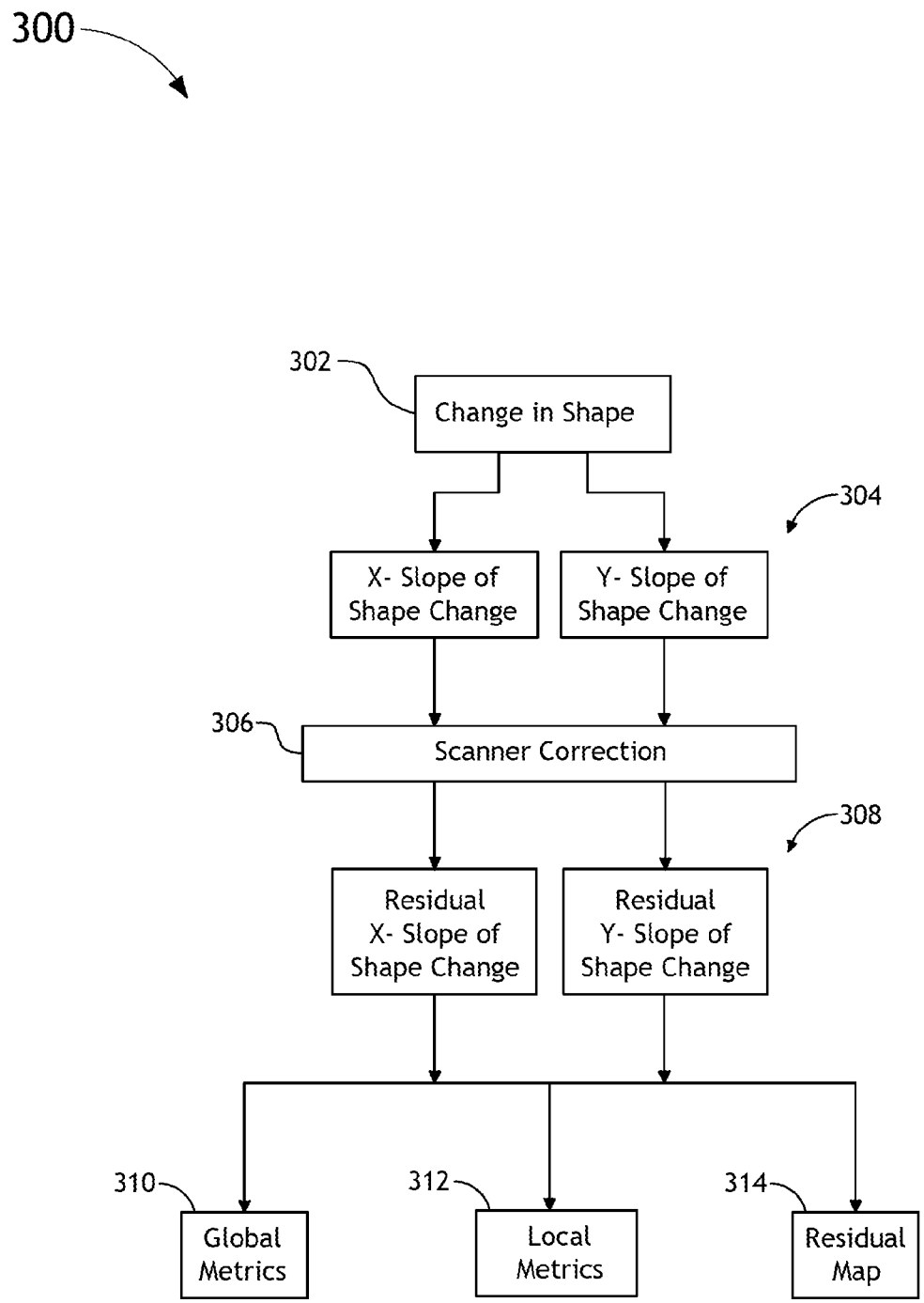
FIG. 3A illustrates a functional block diagram of wafer geometry metric generation, in accordance with the present invention.

FIG. 3A illustrates a high-level functional block diagram 300 depicting the generation of one or more slope shape change wafer geometry metrics utilizing a wafer geometry metric algorithm 211 in accordance with one embodiment of the present invention. The topography system 202 may perform a set of shape measurements 302 for both a first process level and an additional process level. The processes levels may include any process level in a semiconductor wafer fabrication process. For example, the process levels (i.e., the first process level or the additional process level) may include any one of bare-wafer processing, chemical-mechanical planarization (CMP), rapid thermal processing (RTP), etching, film deposition, and the like.

Next, the computing system 206 of the system 200 may receive the measurements 302 for the first process level (e.g., level N) and the additional process level (e.g., level N+1) and calculate the slope of shape change between the first process level and the additional process level in the X- and Y-direction 304. Following the slope of shape change calculation, a set of process tool (e.g., scanner) correctables (e.g., linear correctables or higher-order correctables) may be calculated by the computing system 206 and fed to a communicatively coupled process tool (not shown) for correction. Next, residual slope of shape change values for both the X-direction and Y-direction may be calculated 308. Utilizing the calculated residual slope of shape change values 308 the computing system 206 may further generate a global slope shape change metric 310, a set of local slope shape change metrics 312 and/or a residual slope shape change contour map 314.

Figure 3B:
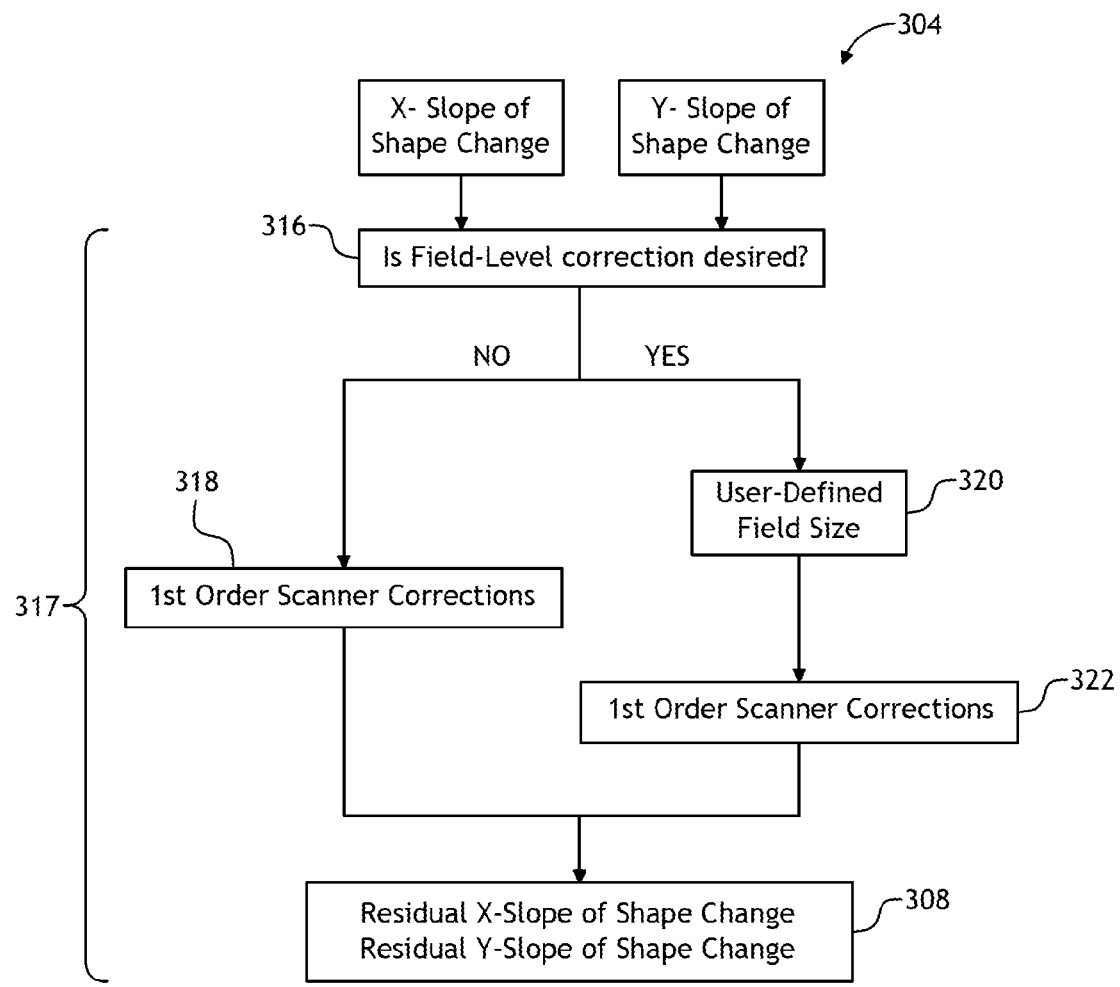
FIG. 3B illustrates a functional block diagram of residual slope of shape change metric calculation using process tool correctables, in accordance with the present invention.

In a further embodiment, the wafer geometry metric algorithm 211 may calculate wafer-level or field-level process tool correctables. FIG. 3B illustrates a high-level functional block diagram depicting the calculation of process tool correctables 317, in accordance with one embodiment of the present invention. Following the slope of shape change calculation 304, the computing system 206 may calculate either wafer-level or field-level correctables. In the case of wafer-level corrections, the computing system 206 may calculate correctables, at a wafer level, based on a selected process tool correction routine suitable for calculating the residual overlay. Then, using these correctables the computing system 206 may calculate the residual slope of shape change in the X-direction and the Y-direction 324. In the case of field-level corrections, the user or a user controlled sub-system may select a field size. Then, the computing system 206 may calculate correctables, at a field-level, based on a selected process tool correction routine suitable for calculating the residual overlay.

In turn, using these correctables the computing system 206 may calculate the residual slope of shape change in the X-direction and the Y-direction 308. In a further aspect, the computing system 206 may then calculate one or more global metrics 310 and/or one or more local metrics 312. In addition, utilizing the calculated set of slope of shape change residuals 308, the computing system 206 may generate a contour map 314 depicting the slope of shape change residuals as a function of position on a two-dimensional grid. This map 314 may then be presented to a user via a display device (not shown). The computing system 206 may further be configured to receive input from a user interface device (e.g., mouse, keyboard, trackpad, touchscreen, and the like) allowing a user to "tag" or identify regions of interest on the contour map 314 displayed via the display device.

Figure 3C:
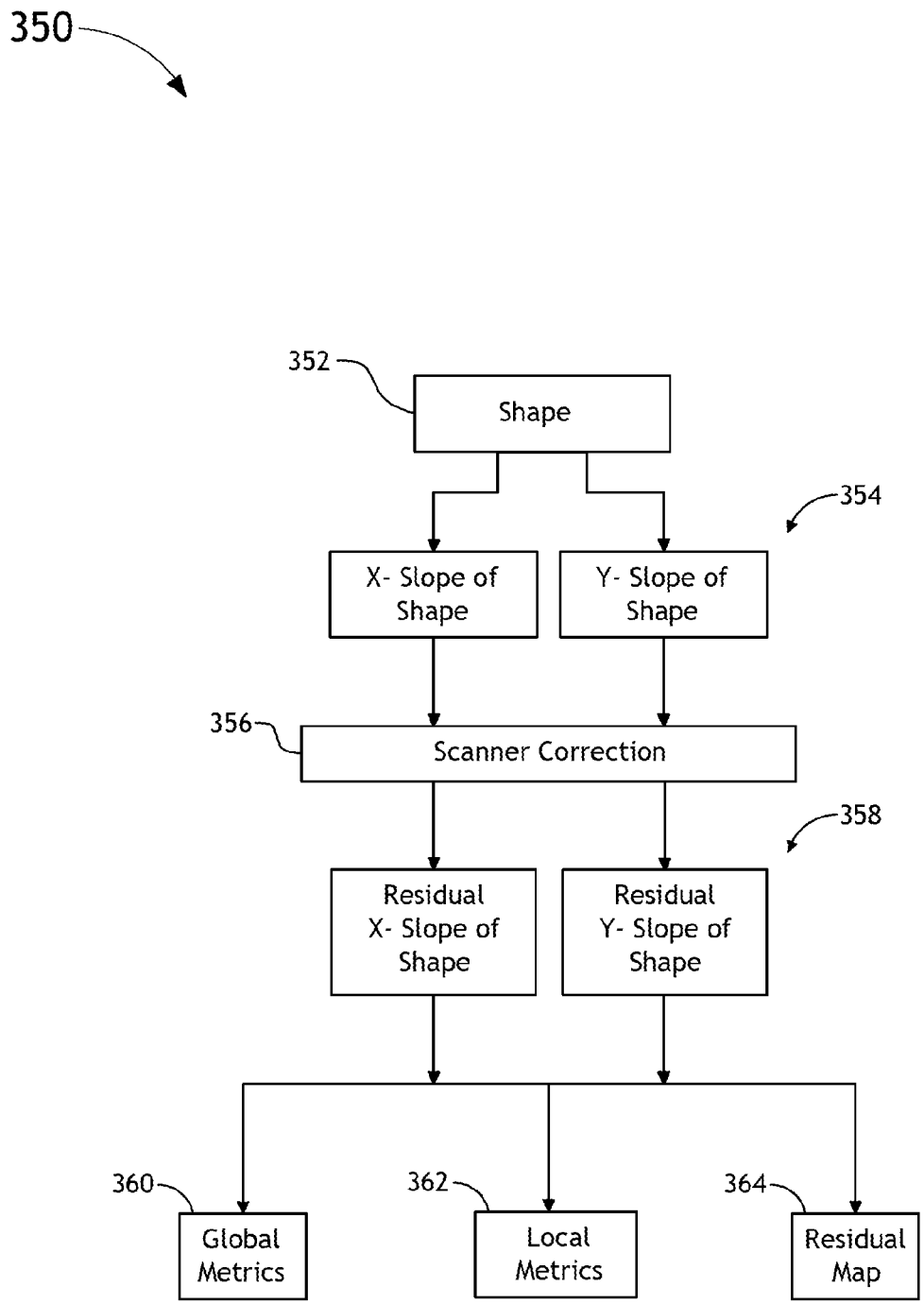
FIG. 3C illustrates a functional block diagram of wafer geometry metric generation, in accordance with the present invention.

FIG. 3C illustrates a high-level functional block diagram 350 depicting the generation of one or more slope shape wafer geometry metrics utilizing an alternative embodiment of the wafer geometry metric algorithm 211, in accordance with an alternative embodiment of the present invention. The system 200 may perform a set of shape measurements 352 of a wafer at a selected process level (e.g., a bare-wafer process). Then, the computing system 206 of the system may receive these measurements and calculate the slope of shape in the X- and Y-direction 354. Following the slope of shape calculation, a set of process tool (e.g., scanner) correctables (e.g., linear correctables or higher-order correctables) may be calculated by the computing system 206 and fed to a communicatively coupled process tool (not shown) for correction. Next, residual slope of shape values for both the X- and Y-direction may be calculated 358. Utilizing the calculated residual slope of shape values 358 the computing system 206 may further generate a global slope shape metric 360, a set of local slope shape metrics 362 and/or a two-dimensional residual slope shape map 364. It is further noted that the residual slope shape is calculated from the process tool correctables in a manner similar to that depicted in FIG. 3B and, therefore, the description of FIG. 3B should be interpreted to extend to FIG. 3C. It is further noted that details related to the generation of one or more slope shape wafer geometry metrics and one or more slope shape change metrics are described in greater detail further herein.

Figure 4:
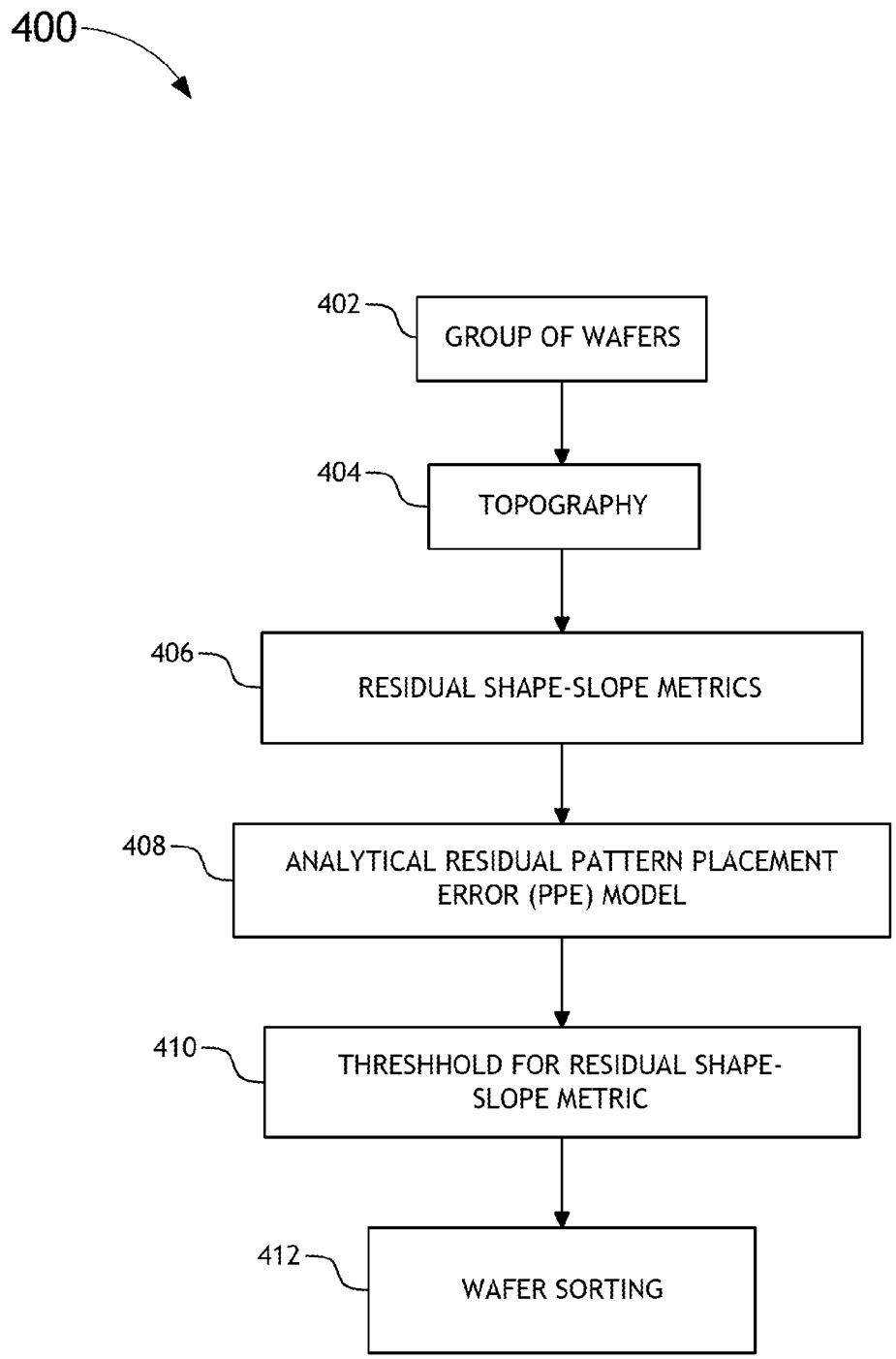
FIG. 4 illustrates a functional block diagram of wafer sorting utilizing a wafer geometry metric, in accordance with the present invention.

FIG. 4 illustrates a high-level functional block diagram 400 depicting the sorting of wafers utilizing a wafer sorting algorithm 212. In one aspect, the system 200 may sort a group of wafers utilizing a slope of shape metric as described previously with respect to FIG. 3C. The system 200 may acquire a set of wafer shape values via a set of topography measurements 404 from each of a group of wafers 402 at a selected process level (e.g., bare wafer process level). It is noted that the wafer shape values may be acquired in one of the various manners described throughout the present invention. Then, the computing system 206 may calculate a set of residual slope shape metrics 406 for each of the wafers 402. The calculation of each of the residual slope shape metrics may be carried out in a manner similar to that described previously herein, and which will be described in greater detail further herein. Next, the system 200 may determine a set of pattern placement error (PPE) residual values utilizing an analytical residual PPE model 408. In determining the set of PPE residual values, the system 200 may determine a neutral surface of the wafer in a chucked state and then calculate a neutral surface factor (NSF) for each wafer utilizing the neutral surface for each wafer and a set of positions associated with a set of patterns of each wafer. Applicant notes that the concept of neutral surface and neutral surface factor will be described in greater detail further herein. The set of pattern placement error (PPE) residual values may be calculated for each wafer. In this regard, a PPE residual value for each measured point of each wafer may be calculated by determining the product of at least the calculated NSF for each wafer, the residual slope shape metric for the point, and a thickness of the wafer. In turn, a threshold 410, or "specification," for the set of residual shape metrics may be found that maintains the set of PPE residuals below a selected level. Then, the group of wafers may be sorted 412 based on the measured residual shape slope 406 of each wafer and the threshold 410 required to maintain PPE residuals below a selected level (selected level determined by requirements of specific process or technology). It is noted herein that wafer sorting in the context of the present invention is described in greater detail further herein.

Figure 5:
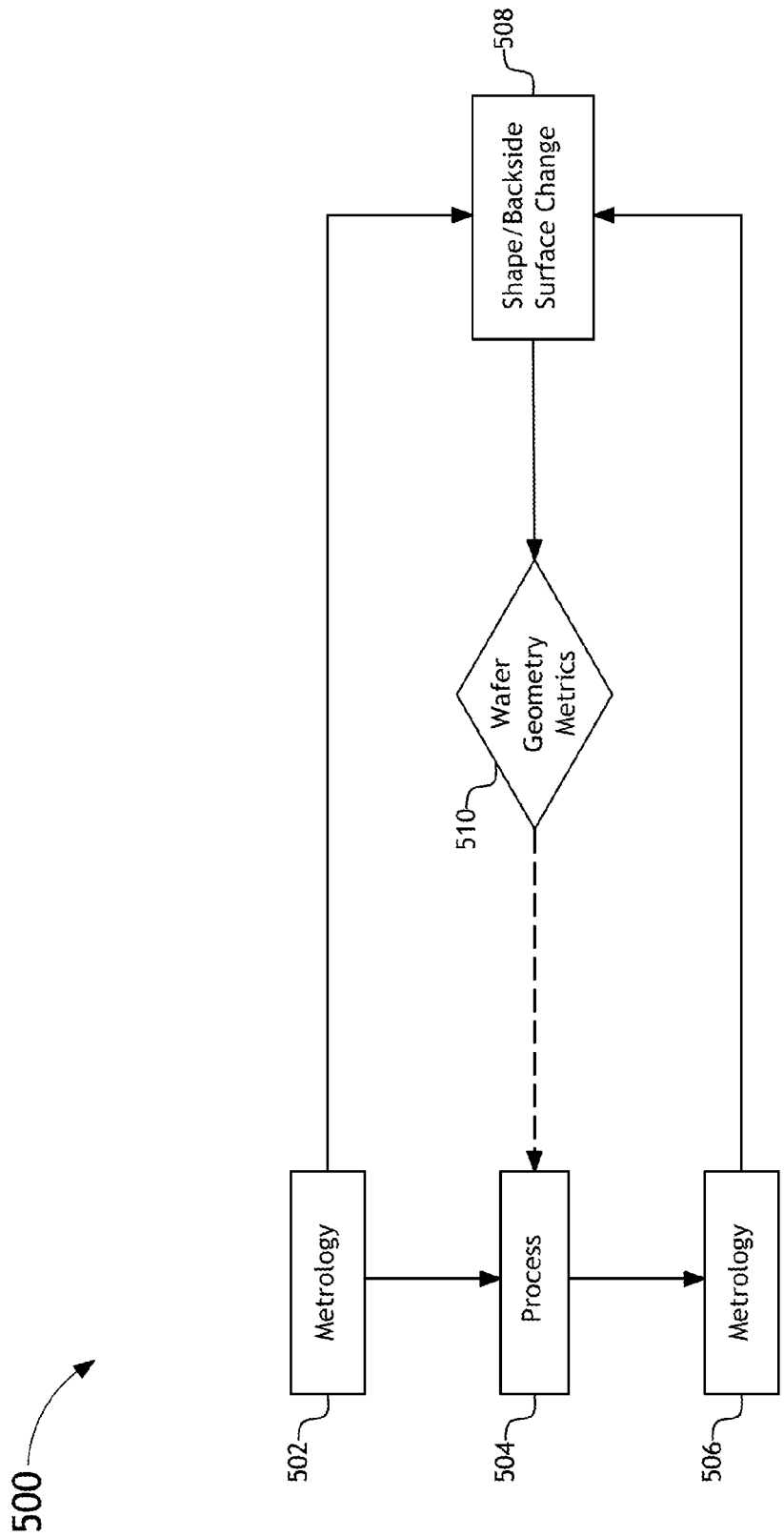
FIG. 5 illustrates a functional block diagram of process feedback control utilizing a wafer geometry metric, in accordance with the present invention.

FIG. 5 illustrates a high-level functional block diagram 500 depicting process control utilizing a process control algorithm 213, in accordance with one embodiment of the present invention. The topography system 202 may perform a set of shape measurements for both a first process level 502 and an additional process level 506. The computing system 206 of the system 200 may receive the measurements 502 and 506 for the first process level (e.g., level N) and the additional process level (e.g., level N+1) and calculate the slope of shape change 508 (e.g., front-side slope of shape change or back-side slope of shape change) associated with the process 504 between the first process level and the additional process level in the X- and Y-direction. Following the slope of shape change calculation, residual slope of shape change values for both the X-direction and Y-direction may be determined. Utilizing the residual slope of shape change values the computing system 206 may further generate one or more slope shape change metrics 510. It is noted herein that the slope shape change metrics 510 may be generated in any of the various manners discussed throughout the present disclosure. Then, based on the generated wafer slope shape change metrics 510, the system 200 may provide feedback to the process tool, thereby providing process control to the one or more process tools. The process tools may include any process tools known in the art, such as, but not limited to a RTP system, a film deposition system, a CMP system, and an etching system.

Figure 6:
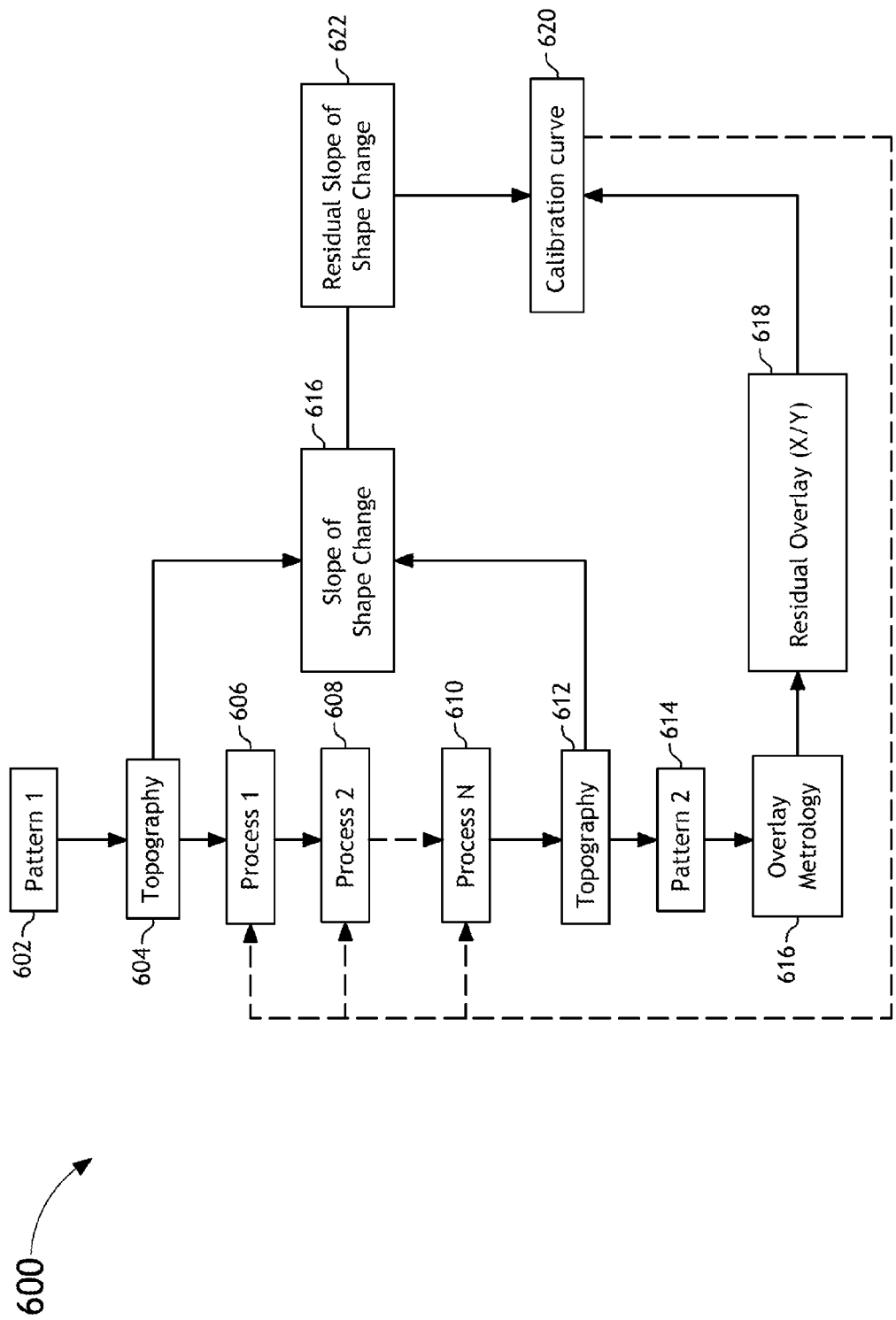
FIG. 6 illustrates a functional block diagram of overlay control utilizing a wafer geometry metric, in accordance with the present invention.

FIG. 6 illustrates a high-level function block diagram 600 depicting overlay control utilizing an overlay control algorithm 215, in accordance with one embodiment of the present invention. The topography system 202 may perform a set of shape measurements on a wafer at a first process level 604 and then an additional process level 612, following a series of processes (e.g., first process 606, second process 608, and up to and include an Nth process 610) between a first patterning step 602 and a second patterning step 614. The computing system 206 of the system 200 may receive the measurements 604 and 612 for the first process level (e.g., level N) and the additional process level (e.g., level N+1) and calculate the slope of shape change 616 (e.g., front-side slope of shape change or back-side slope of shape change) associated with the process steps 606, 608, and 610 between the first process level 604 and the additional process level 612 in the X- and Y-direction. Following the slope of shape change calculation, residual slope of shape change values and residual slope of shape change metrics 622 for both the X-direction and Y-direction may be determined. It is noted herein that the residual slope shape change and the associated residual slope shape change metrics 622 may be generated in any of the various manners discussed throughout the present disclosure. In addition, the system 200 may acquire a set of overlay values 616 from a plurality of measurement points on the surface of the wafer at the additional process level (i.e., the process level following the selected N-number of processes being analyzed). For example, the system 200 may include an overlay metrology tool (not shown) that is configured to perform overlay metrology on a set of metrology targets of the wafer. In turn, these overlay metrology measurements may be transmitted to the computing system 206, whereby the computing system 206 may generate a set of overlay residuals and a set of corresponding overlay residual metrics 618. It is recognized that the calculation of overlay residuals may be performed in any manner known in the art (e.g., linear methodology or higher-order methodology). It is further recognized that the overlay residual metrics 618 may be generated in any of the various manners discussed throughout the present disclosure.

Next, the computing system 206 may utilize the calculated set of slope shape change residual metrics and the calculated set of overlay residual metrics to form a calibration curve for the given one or more analyzed processes, process 1 through process N. The calibration curve is configured to relate the set of overlay residuals (or overlay residual metrics) to the set of wafer slope shape change residuals (or wafer slope shape change metrics). Applicant notes that the generation of the calibration curve will be described in more detailed further herein. Based on the calibration curve a residual slope shape change threshold may be found that is suitable for maintaining residual overlay below a selected level (e.g., specification below a selected distance). The computing system 206 may further sort a group of wafers by generating a set of residual slope shape change metrics for each of the wafer and then comparing the acquired set of residual slope shape change metrics to the determined threshold. Utilizing this process the system 200 may act to sort wafers to meet lithography overlay residual process specifications by monitoring wafer slope shape change metrics.

It should be recognized that the various steps described throughout the present disclosure may be carried out by a single computer system or, alternatively, a multiple computer system. Moreover, different subsystems of the system 200, such as topography system 202, may include a computer system suitable for carrying out at least a portion of the steps described above. Therefore, the above description should not be interpreted as a limitation on the present invention but merely an illustration. Further, the one or more computing systems 206 may be configured to perform any other step(s) of any of the method embodiments described herein. In another embodiment, the computer system 206 may be communicatively coupled to the topography system 202 or a process tool (not shown) in any manner known in the art. For example, the one or more computer systems 206 may be coupled to a computer system of the topography system 202 or to a computer system of a process tool. In another example, the topography system 202 and a process tool may be controlled by a single computer system. In this manner, the computer system 206 of the system 200 may be coupled to a single topography-process tool computer system. Moreover, the computer system 206 of the system 200 may be configured to receive and/or acquire data or information from other systems (e.g., inspection results from an inspection system, metrology results from an additional metrology system, or process tool correctables calculated from a system, such as KLA-Tencor's KT Analyzer) by a transmission medium that may include wireline and/or wireless portions. In this manner, the transmission medium may serve as a data link between the computer system 206 and other subsystems of the system 200. Moreover, the computer system 206 may send data to external systems via a transmission medium.

The computing system 206 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium. Program instructions 208 implementing methods such as those described herein may be transmitted over or stored on carrier medium 210. The carrier medium may be a transmission medium such as a wire, cable, or wireless transmission link. The carrier medium may also include a storage medium such as a read-only memory, a random access memory, a magnetic or optical disk, a magnetic tape, or the like.

The embodiments of the system 200 illustrated in FIG. 2 may be further configured as described herein. In addition, the system 200 may be configured to perform any other step (s) of any of the method embodiment(s) described herein.

Figure 7:
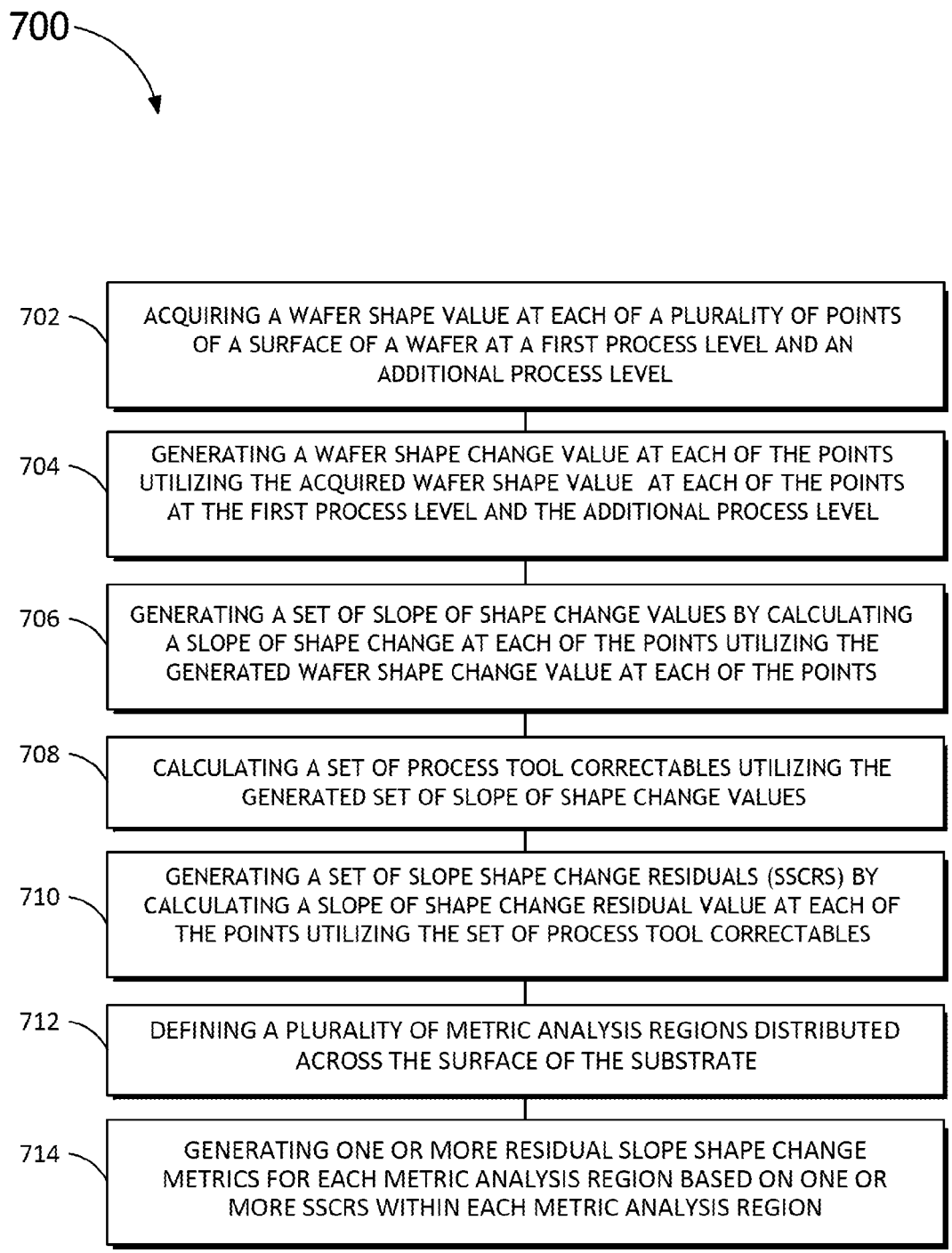
FIG. 7 illustrates a process flow diagram for providing a wafer metric, in accordance with the present invention.

FIG. 7 illustrates a process 700 for providing a wafer geometry metric suitable for implementation by the system 200 of the present invention. In one aspect, it is recognized that data processing steps of the process flow 700 may be carried out via a pre-programmed algorithm executed by one or more processors of the one or more computing systems 206. While the following description is presented in the context of system 200, it is recognized herein that the particular structural aspects of system 200 do not represent limitations and should be interpreted as illustrative only.

In step 702, a wafer shape value at each of a plurality of points of a surface of a wafer maybe acquired at a first process level and a second process level. In one embodiment, a set of wafer shape values corresponding to a selected number of measurement points on a surface of a wafer 204 may be acquired using a topography measurement system 202. In a further embodiment, the topography measurement system 202 may receive a wafer 204 in a substantially vertical position and in a substantially free state. For example, a finger gripper (e.g., three finger gripper) may be implemented to receive and hold the wafer in a vertical position. In this sense, the topography system 202 may collect data from the wafer in an "unchucked" free state such that the shape of a back surface of the wafer does not impact the shape of the front surface of the wafer.

The wafer shape may be quantified at a selected number of points and positions across a surface of the wafer (e.g., front-side of wafer or back-side of wafer) at a first wafer process level (e.g., bare wafer state) and at an additional process level (e.g., first patterning level). In a general sense, the wafer may be quantified across a surface of the wafer at a process level N and at process level N+1. As noted previously herein, the topography system 202 may include an interferometric based system, such as, but not limited to, a dual Fizeau interferometer 220. Utilizing the dual Fizeau interferometry system 220 of system 200, the dual interferometers of the system 220 may simultaneously measure height variations of both the front-side surface and back-side surface of the wafer 204. A two-dimensional shape map s(x,y) may be constructed using the shape value calculated at each of the measured points utilizing the measured height variation at those points and Eq.1 (or an analog to Eq.1). It is recognized herein that the computing system 206 may execute the calculation of the shape at each of the grid of points of the wafer surface using Eq. 1 and then form the shape map (e.g., numerical value plot map or a contrast map) using each of the calculated shape values. It is further recognized that any number of methods may exist to measure shape of a wafer and the methodology described above should be interpreted as merely an illustration of one such method.

In an alternative embodiment, the values of the shape of a wafer in question may be received from a system other than the topography system 202. Applicant notes that, while the above description has primarily described the system 200 as including a topography system 200, the topography measurements used in process 700 need not be performed contemporaneously with the subsequent calculations of shape change, slope shape change, process tool correctables, and the like, as discussed in the remainder of the present disclosure. For example, the shape values may be received from a remote user (not shown). In another example, the shape values may be retrieved from a memory (not shown) of the system 200.

In step 704, a wafer shape change value may be generated for each of the points of the set of points of step at the first process level (e.g., level N) and the additional process level (e.g., level N+1) using the set of wafer shape values found in step 702. In this regard, the wafer shape change value at each point corresponds to a change in wafer shape between the first process level and the second process level. In one embodiment, the calculated wafer shape change values for each of the points may be used to form a two-dimensional (e.g., X-Y) shape change map. It is noted herein that the wafer shape change value generated at each point may include a front-side surface change or a back-side surface change.

In step 706, a set of slope of shape change values may be generated by calculating a slope of shape change at each of the points utilizing the generated wafer shape change value at each of the points found in step 704. In this regard, each of the slope of shape change values corresponds to a slope of the change in wafer shape along at least one direction (e.g., X-direction or Y-direction) of the surface of the wafer 204. In one embodiment, each of the slope of shape change values may be computed using the shape change values of neighboring points of the two-dimensional map of step 704. In other embodiments, the set of slope of shape change values may include a set of front-side surface change values or a set of back-side surface change values.

In step 708, a set of process tool correctable may be calculated. In one aspect, the set of process tool correctables may be calculated utilizing the set of slope of change values of step 706. In one embodiment, the set of process tool correctables may include wafer-level process tool correctables. In another embodiment, the set of process tool correctables may include field-level process tool correctables. In the case of field level process tool correctables, the field size used in calculating the set of correctables is user-definable. It is further noted that the process tool correctable may be linear or higher-order. In the case of a wafer-level first order correction, the correctables may take the form:

$$dx = \Delta x - \theta_x y_{wafer} + \Delta M_x x_{wafer} \quad \text{(Eq. 2)}$$

$$dy = \Delta y + \theta_y x_{wafer} + \Delta M_y y_{wafer} \quad \text{(Eq. 3)}$$

where dx and dy represent the corrections in the x-direction and y-direction respectively, $\Delta x$ and $\Delta y$ represent the shift in x-direction and y-direction respectively, and $\Delta M_x$ and $\Delta M_y$ represent the magnification correction in the x-direction and y-direction respectively. Moreover, in the case of field-level first order correction, the correctables may take the form:

$$dx = \Delta x - \theta_x y_{wafer} + \Delta M_x x_{wafer} - \phi_x y_{field} + \Delta m_x x_{field} \quad \text{(Eq. 4)}$$

$$dy = \Delta y + \theta_y x_{wafer} + \Delta M_y y_{wafer} + \phi_y x_{field} + \Delta m_y y_{field} \quad \text{(Eq. 5)}$$

where $\phi_x y_{field}$ and $\phi_y x_{field}$ represent rotational field-level terms and $\Delta m_x x_{field}$ and $\Delta m_y y_{field}$ represent magnification field-level correction terms. In step 710, a set of slope shape change residuals (SSCRs) may be generated by calculating a slope of shape change residual value at each of the points utilizing the set of process tool correctables of step 708.

The calculation of wafer-level and field-level process tool correctables as well as linear and higher-order process tool correctables and the general calculation of residuals are described in U.S. Pat. No. 7,876,438, issued on Jan. 25, 2011, which is incorporated herein by reference in the entirety.

In step 712, a plurality of metric analysis regions distributed across the surface of the substrate may be defined. In one aspect, each metric analysis region may encompass one or more points of the plurality of points. In additional aspects, the size, frequency, and position of the metric analysis regions are user selectable. For example, a user may select each region to have a selected geometrical shape. For instance, at least some of the plurality of metric analysis regions may include a rectangle, a radial band, or a radial sector. For example, the plurality of metric analysis regions may consist of multiple concentric radial bands centered about the center of the wafer, with each band having a selected thickness along the radial direction. By way of another example, the plurality of metric analysis regions may consist of multiple radial sectors distributed about the center of the wafer, with each sector defined by a selected angle.

In another example, the plurality of metric analysis regions may consist of multiple rectangular regions distributed about the wafer in a grid-like manner, with each sector defined by a thickness in the X- and Y-directions. In a further embodiment, the size and frequency of the regions may be selected based on field or die dimensions. For example, a given region may have a size of approximately 25 mm by 10 mm, corresponding to the size of a specific lithographic site on the wafer. In this regard, it is noted that different regions of the plurality of metric analysis regions may different sizes, specified according to the size of the integrated circuits in question.

In a further embodiment, step 712 may include forming 50 to 1000 analysis regions distributed across the wafer surface. Applicant notes that the above described geometrical arrangement for the metric analysis regions is not limiting and should be interpreted merely as illustrative. Those skilled in the art should recognize that the metric analysis regions may be formed by a variety of geometrical shapes, arrangements, and frequency.

In step 714, one or more residual slope shape change metrics for each metric analysis region may be generated based on one or more SSCRs within each metric analysis region. In this regard, the residual slope shape change values encompassed by a given metric analysis region may be used to calculate a residual slope shape change metric for that region. In one embodiment, a residual slope shape change mean metric may be generated for each region by calculating the mathematical mean for the residual slope shape change values contained within each region. In another embodiment, a residual slope shape change median metric may be generated for each region by finding the mathematical median for the residual slope shape change values contained within each region. In another embodiment, a residual slope shape change max/min metric may be generated for each region by finding the maximum or minimum residual slope shape change value of the set of residual slope shape change values contained within each region. In another embodiment, a residual slope shape change range metric may be generated for each region by finding the range (e.g., difference between maximum and minimum) in the residual slope shape change values contained within each region. In another embodiment, a residual slope shape change deviation metric may be generated for each region by finding a deviation (e.g., standard deviation) in a distribution of the residual slope shape change values contained within each region.

In a further embodiment, metric values from multiple regions may be used to form a single global residual shape slope change wafer metric. For example, each of the mean metric values calculated for each of the analysis regions may be combined to form a global mean metric value for the entire wafer. By way of another example, a global range metric may be formed utilizing two or more of the residual slope shape change mean metrics found above. In one sense, the global range metric may be measured using the range in mean values obtained from each region. In another sense, the global range metric may be measured using the smallest minimum metric found for the regions and the largest maximum metric found for the regions. In a general sense, any combination of the metrics obtained from the individual regions may be used to form a global residual slope shape change metric, thereby characterizing the residual slope shape change at the wafer level.

In a further step, the process 700 may generate a contour map of the residual slope shape change metrics found in step 714. For example, the metrics calculated in step 714 may be plotted on a two-dimensional grid, with the magnitude of each metric value associated with a selected region depicted along the "z-direction." In another example, the metrics calculated in step 714 may be depicted as numerical values on a two-dimensional map. In a further embodiment, the system 200 may present the contour map to a user via a display device (not shown). Utilizing a user interface device the user may identify excursion regions of the wafer. In turn, the user may flag one or more of the identify excursion regions found on the wafer and the system 200 may then control subsequent processes in those identified regions.

In a further step, the process 700 may generate one or more residual overlay metrics for each metric analysis region based on one or more residual overlay values within each metric analysis region. In this regard, the residual overlay values encompassed by a given metric analysis region may be used to calculate a residual overlay metric for that region. In one embodiment, a residual overlay mean metric may be generated for each region by calculating the mathematical mean for the residual overlay values contained within each region. In another embodiment, a residual overlay median metric may be generated for each region by finding the mathematical median for the residual overlay values contained within each region. In another embodiment, a residual overlay max/min metric may be generated for each region by finding the maximum or minimum residual overlay value of the set of residual overlay values contained within each region. In another embodiment, a residual overlay range metric may be generated for each region by finding the range (e.g., difference between maximum and minimum) in the residual overlay values contained within each region. In another embodiment, a residual overlay deviation metric may be generated for each region by finding a deviation (e.g., standard deviation) in a distribution of the residual overlay contained within each region.

In a further embodiment, metric values from multiple regions may be used to form a single global residual overlay wafer metric. For example, each of the mean metric values calculated for each of the analysis regions may be combined to form a global mean residual overlay metric value for the entire wafer. By way of another example, a global range metric may be formed utilizing two or more of the residual overlay mean metrics found above. In one sense, the global range metric may be measured using the range in mean values obtained from each region. In another sense, the global range metric may be measured using the smallest minimum metric found for the regions and the largest maximum metric found for the regions. In a general sense, any combination of the metrics obtained from the individual regions may be used to form a global residual overlay metric, thereby characterizing the residual overlay at the wafer level.

Figure 8:
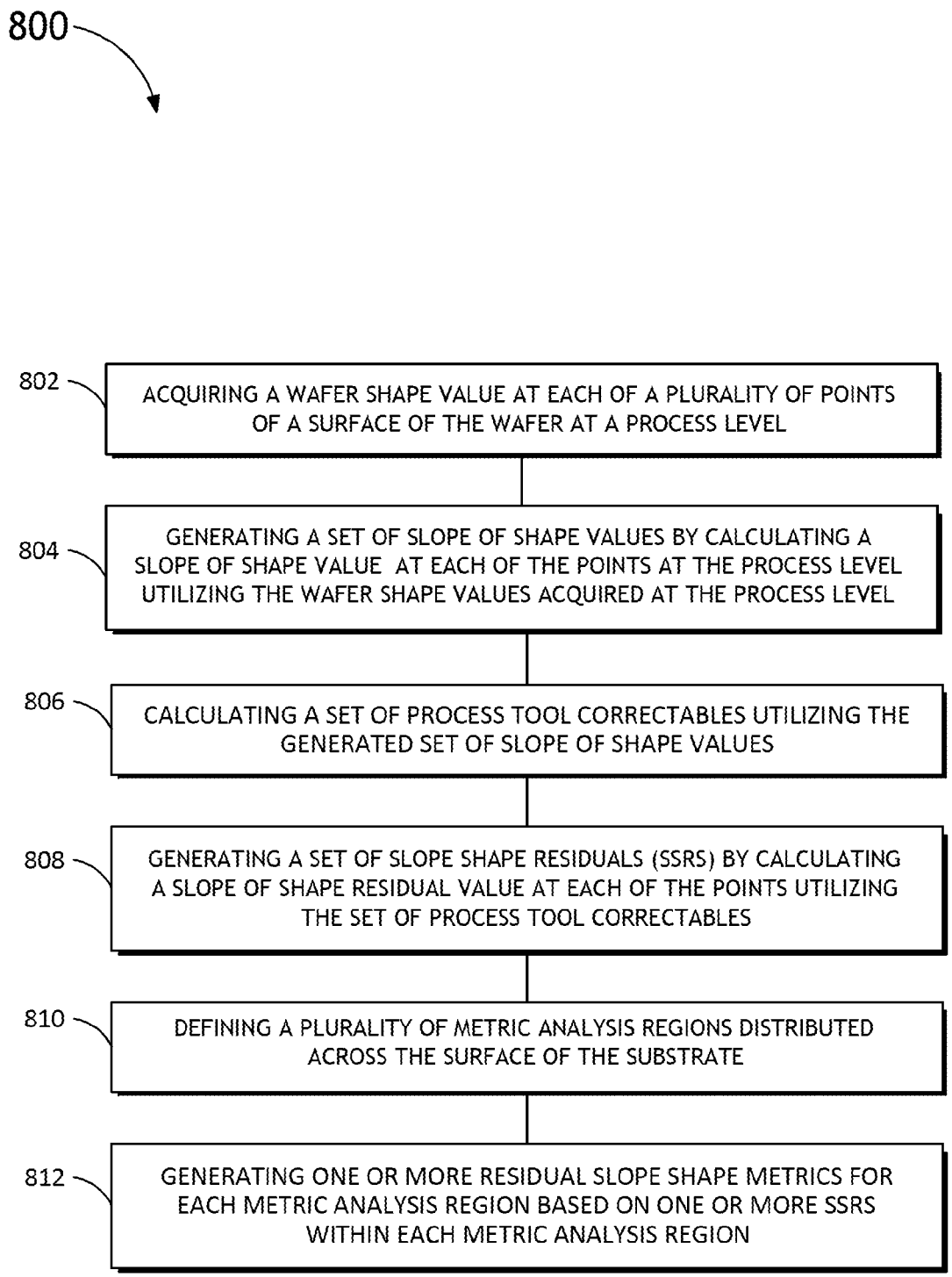
FIG. 8 illustrates a process flow diagram for providing a wafer metric, in accordance with the present invention.

FIG. 8 illustrates a process 800 providing a wafer geometry metric suitable for implementation by system 200 of the present invention. In one aspect, it is recognized that data processing steps of the process flow 800 may be carried out via a pre-programmed algorithm executed by one or more processors of the one or more computing systems 206. While the following description is presented in the context of system 200, it is recognized herein that the particular structural aspects of system 200 do not represent limitations and should be interpreted as illustrative only.

In step 802, a wafer shape value at each of a plurality of points of a surface of a wafer maybe acquired at a selected process level. It is noted herein that the wafer shape values may be acquired in a manner similar to that described in step 702 of process flow 700 described previously herein.

In step 804, a set of slope of shape values may be generated by calculating a slope of shape at each of the points utilizing the generated wafer shape value at each of the points found in step 802. In this regard, each of the slope of shape values corresponds to a slope of the wafer shape along at least one direction (e.g., X-direction or Y-direction) of the surface of the wafer 204. In one embodiment, each of the slope of shape values may be computed using the shape values of neighboring points of a two-dimensional map formed using the wafer shape values acquired in step 802. It is noted herein that the wafer shape slope values generated at each point may include a front-side surface shape slope or a back-side surface shape slope.

In step 806, a set of process tool correctable may be calculated. In one aspect, the set of process tool correctables may be calculated utilizing the set of slope of shape values of step 804. As in process flow 700, the set of process tool correctables may include wafer-level process tool correctables or field-level process tool correctables. It is noted herein that the calculation of process tool correctables is similar to that described in process flow 700. As such, the description of process tool correctable calculation of process 700 should be interpreted to extend to step 806 of process 800. In step 808, a set of slope shape residuals (SSRs) may be generated by calculating a slope of shape residual value at each of the points utilizing the set of process tool correctables of step 806. In step 810, a plurality of metric analysis regions distributed across the surface of the substrate may be defined. In step 812, one or more residual slope shape metrics for each metric analysis region may be generated based on one or more SSRs within each metric analysis region. It is noted herein that steps 808-812 are analogous to steps 710-714 of process flow 700. As such, the description of steps 710-714 should be interpreted to extend to the process steps 808-812 of process flow 800.

Figure 9A:
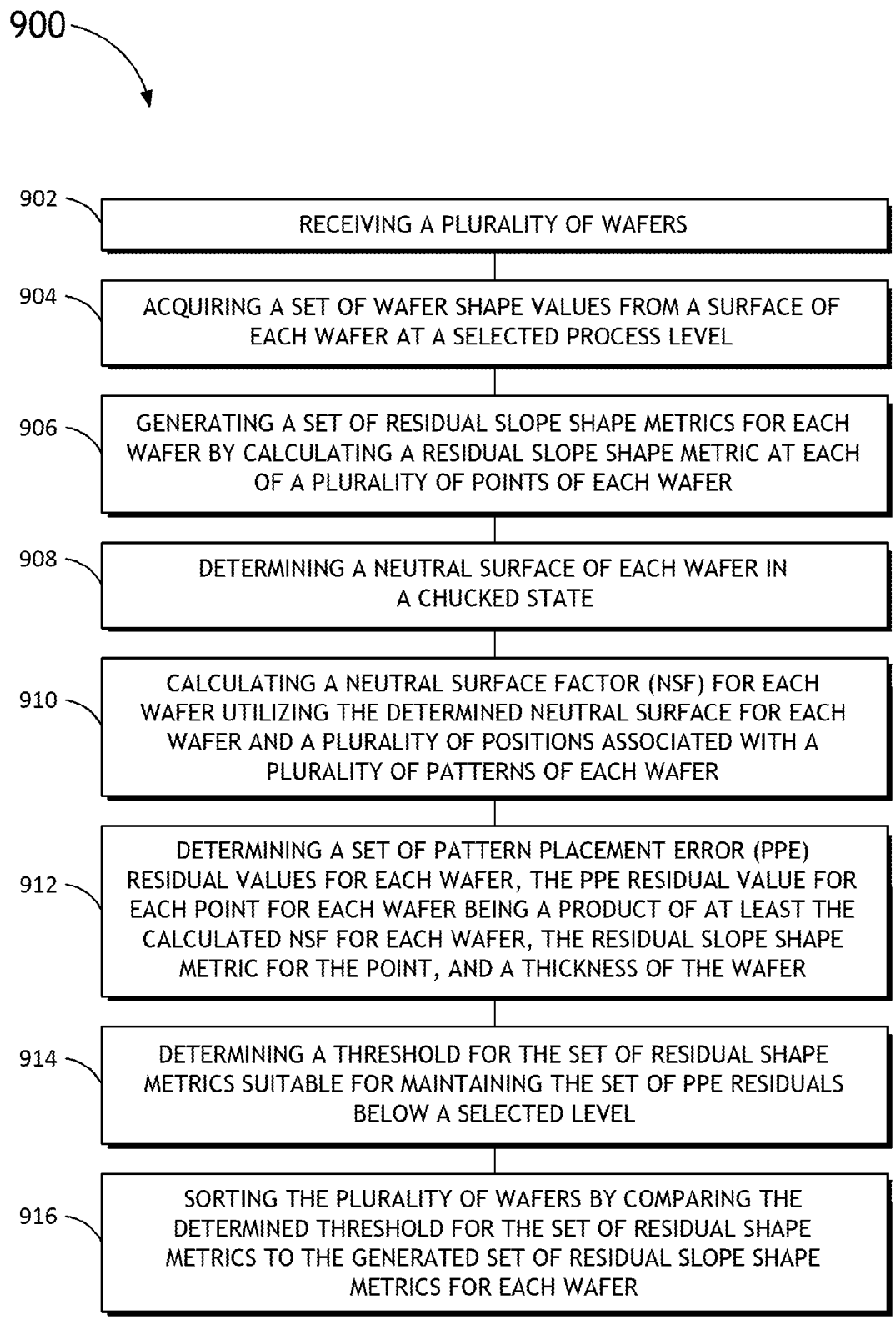
FIG. 9A illustrates a process flow diagram for sorting a plurality of wafers utilizing a wafer geometry metric, in accordance with the present invention.

FIG. 9A illustrates a process 900 for sorting wafers utilizing a slope of shape metric suitable for implementation by system 200 of the present invention. In one aspect, it is recognized that data processing steps of the process flow 900 may be carried out via a pre-programmed algorithm executed by one or more processors of the one or more computing systems 206. While the following description is presented in the context of system 200, it is recognized herein that the particular structural aspects of system 200 do not represent limitations and should be interpreted as illustrative only.

In step 902, a set of wafers may be received by the system 200. For example, a set of bare wafers may be received by the system 200. In step 904, a set of wafer shape values from a surface of each wafer at a selected process level (e.g., bare wafer process level) may be acquired. In step 906, a set of residual slope shape metrics for each wafer may be generated by calculating a residual slope shape metric at each of a plurality of points of each wafer. It is noted herein that the wafer shape slope values generated at each point may include a front-side surface shape slope or a back-side surface shape slope. It is further noted that the steps 902 through 906 are previously described throughout the present disclosure. For example, the residual slope shape metrics generated in process flow 800 may be interpreted to extend to steps of finding a set of residual slope shape metrics for each of the wafers of process 900.

Figure 9B:
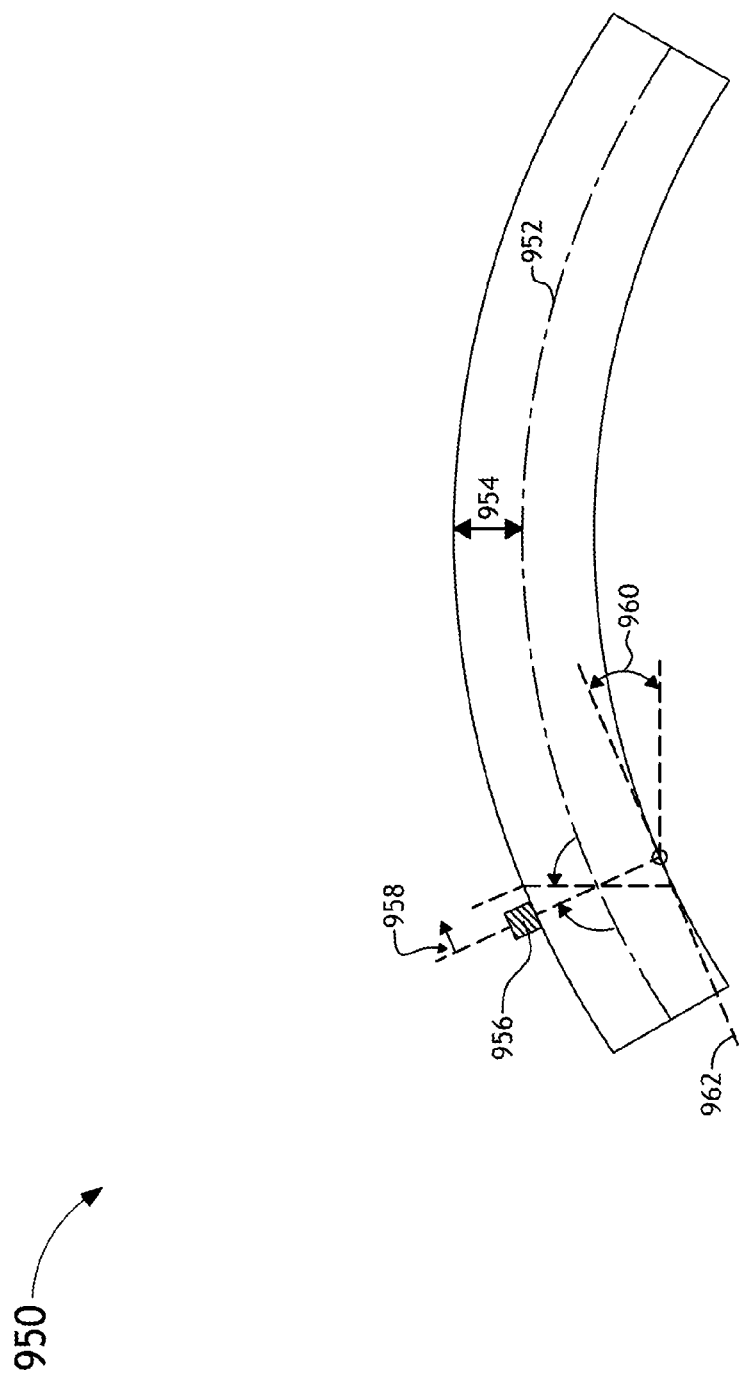
FIG. 9B illustrates a conceptual view of a neutral surface and neutral surface factor (NSF) of a wafer, in accordance with the present invention.

In step 908, a neutral surface 952 for each wafer in a chucked state may be determined. In step 910, a neutral surface factor (NSF) for each wafer utilizing the determined neutral surface for each wafer and a plurality of positions associated with a plurality of patterns of each wafer may be calculated. FIG. 9B depicts a conceptual illustration 950 of a neutral surface 952 and a corresponding neutral surface factor. In one embodiment, the neutral surface factor 954 may be interpreted as the distance between the neutral surface and a pattern surface on the wafer, wherein multiple pattern features 956 are disposed. The in-plane distortions created by the change in wafer shape give rise to pattern place errors 958. Pattern placement errors may be derived based on the NSF 954 and the local slope of the back-side surface at each of a set of points and the corresponding slope map of the back-side surface 960. Neutral surface, neutral surface factor, and the calculation of pattern place errors (or "image place error) are discussed in detail in Pradeep Vukkadala, "Correction Strategies to Compensate for Image Placement Errors Induced during EUVL Mask Chucking," The University of Wisconsin—Madison Dissertations & Theses, ProQuest Dissertations & Theses, ISBN 9781124367644 (2010).

In step 912, a set of pattern placement error (PPE) residual values for each wafer may be determined, the PPE residual value for each point for each wafer being a product of at least the calculated NSF for each wafer, the residual slope shape metric for the point, and a thickness of the wafer. In this regard, the pattern placement error residual value for each point may be represented by:

$$PPE_{residual} = NSF \times SlopeShape_{residual} \times t_s \quad (Eq. 6)$$

where NSF is the neutral surface factor, $SlopeShape_{residual}$ is the slope of shape residual value (or slope of shape residual metric) for the given point, as determined through any of the various manners described through the present disclosure, and $t_s$ is the thickness of the wafer.

In step 914, a threshold for the set of residual shape metrics suitable for maintaining the set of PPE residuals below a selected level may be determined. In this regard, a PPE residual value required for a given process or application may be selected. In this sense, the system 200 or user may determine the required PPE residual specification needed for the given device. In turn, a threshold for the residual shape metrics may be determined that will maintain or surpass the selected PPE residual level. In this regard, equation 6 correlates the PPE residual values to the slope of shape residual values, and utilizing this relationship it may be determined what threshold shape residual values are needed in order to meet the requirements for the PPE residuals, which are dictated by the given process or device.

In step 916, the plurality of wafers may be characterized by comparing the determined threshold for the set of residual shape metrics to the generated set of residual slope shape metrics for each wafer. In a further embodiment, the set of wafers may be sorted by comparing the determined one or more thresholds for the set of residual shape metrics to the generated set of residual slope shape metrics for each wafer. In this regard, each wafer of the set of wafers may be binned according to the set of residual shape metrics associated with the given wafer.

In another embodiment, each of the set of wafers may be monitored by comparing the determined one or more thresholds for the set of residual shape metrics to the generated set of residual slope shape metrics for each wafer. In response to the monitoring of the plurality of wafers, one or more processes may be modified in order to maintain the generated set of residual slope shape metrics for each wafer below the one or more thresholds. In an additional embodiment, in response to the monitoring of the plurality of wafers, one or more processes may be developed in order to establish the generated set of residual slope shape metrics for each wafer below the one or more thresholds.

Figure 10:
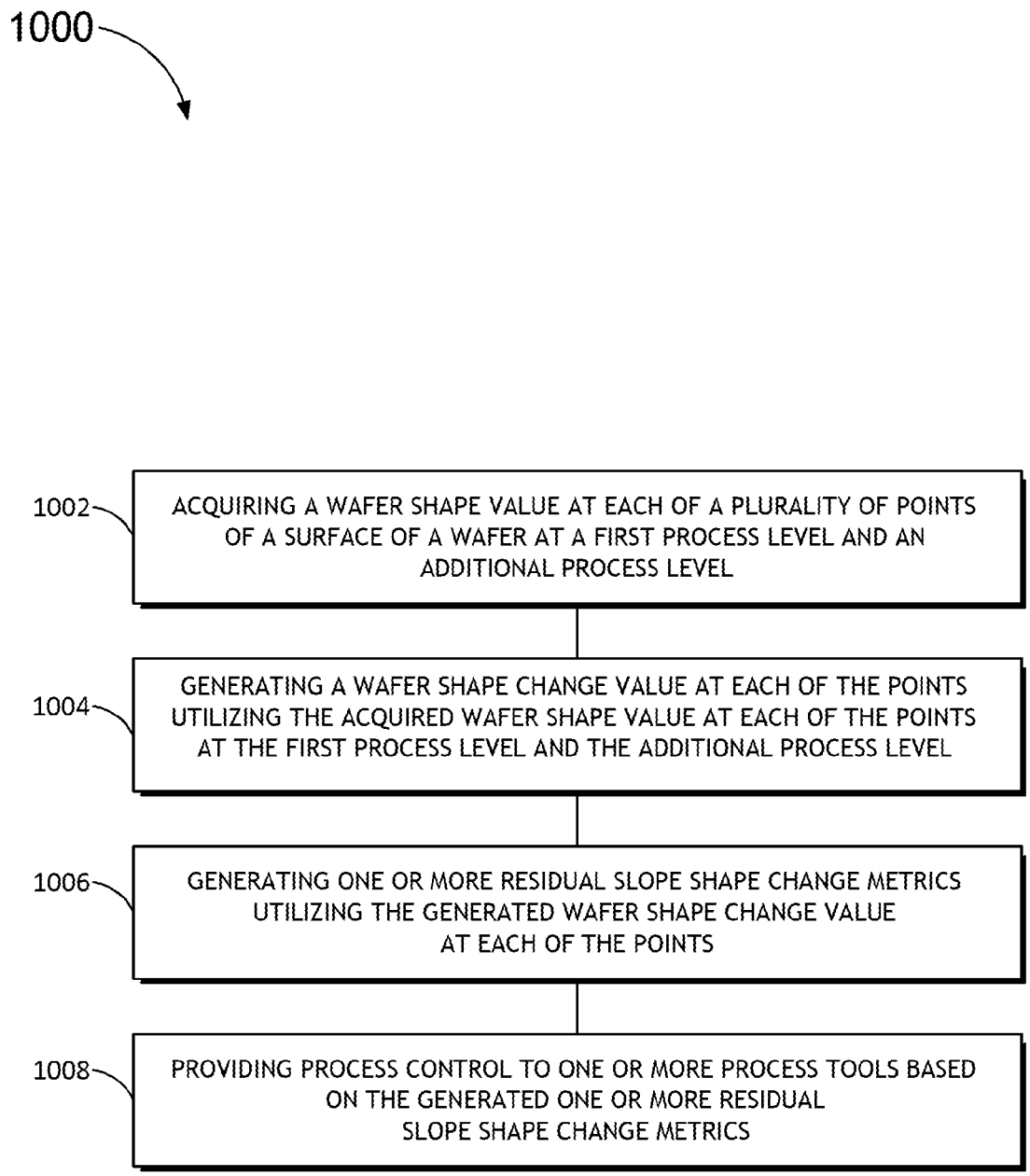
FIG. 10 illustrates a process flow diagram for process control utilizing a wafer geometry metric, in accordance with the present invention.

FIG. 10 illustrates a process 1000 for process uniformity control utilizing a slope of shape change metric suitable for implementation by system 200 of the present invention. In one aspect, it is recognized that data processing steps of the process flow 1000 may be carried out via a pre-programmed algorithm executed by one or more processors of the one or more computing systems 206. While the following description is presented in the context of system 200, it is recognized herein that the particular structural aspects of system 200 do not represent limitations and should be interpreted as illustrative only.

In step 1002, a wafer shape value at each of a plurality of points of a surface of a wafer at a first process level and an additional process level may be acquired. In step 1004, a wafer shape change value at each of the points utilizing the acquired wafer shape value at each of the points at the first process level and the additional process level may be generated, the wafer shape change value at each point corresponding to a change in wafer shape between the first process level and the second process level. In step 1006, one or more residual slope shape change metrics may be generated utilizing the generated wafer shape change value at each of the points. In step 1008, process control to one or more process tools may be provided based on the generated one or more residual slope shape change metrics. In this regard, the monitoring of the slope shape change metrics associated with two or more process (e.g., N and N+1) may be used to control one or more processes. The given process tool may receive feedback from the computing system 206 and, in response to this feedback, the process tool may make adjustments so that the given process creates a wafer shape change (as measured via one of the described slope shape change metrics) that falls within a required specification. The slope shape change metrics may be used to control any process known in the art, such as, but not limited to, CMP, RTP, etching, and film deposition.

Figure 11:
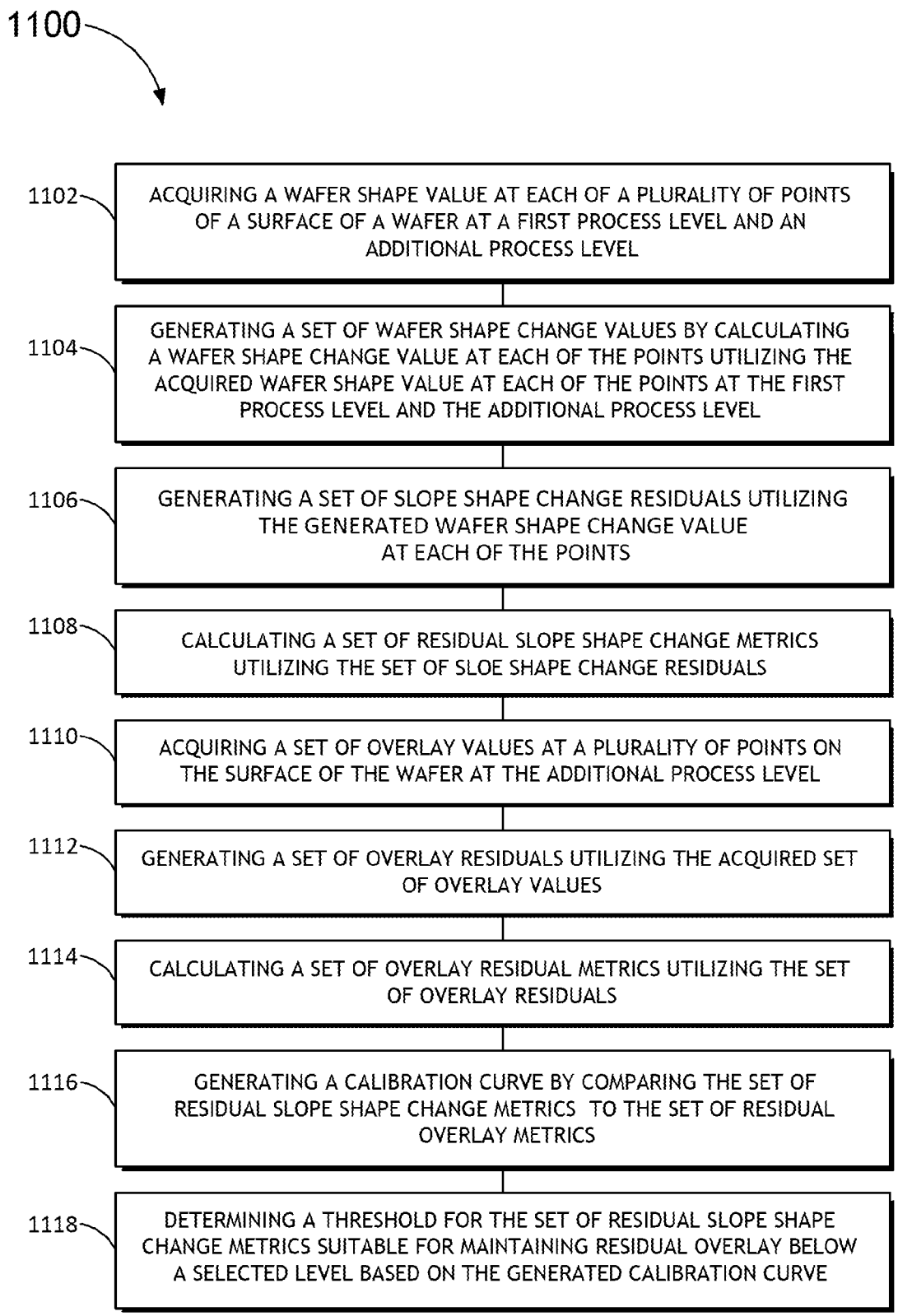
FIG. 11 illustrates a process flow diagram for overlay control utilizing a wafer geometry metric, in accordance with the present invention.

FIG. 11 illustrates a process 1100 for process uniformity control utilizing a slope of shape change metric suitable for implementation by system 200 of the present invention. In one aspect, it is recognized that data processing steps of the process flow 1100 may be carried out via a pre-programmed algorithm executed by one or more processors of the one or more computing systems 206. While the following description is presented in the context of system 200, it is recognized herein that the particular structural aspects of system 200 do not represent limitations and should be interpreted as illustrative only.

In step 1102, a wafer shape value at each of a plurality of points of a surface of a wafer may be acquired at a first process level and an additional process level. In step 1104, a set of wafer shape change values may be generated by calculating a wafer shape change value at each of the points utilizing the acquired wafer shape value at each of the points at the first process level and the additional process level. In step 1106, a set of slope shape change residuals may be generated utilizing the generated wafer shape change value at each of the points. In step 1108, a set of residual slope shape change metrics may be calculated utilizing the set of sloe shape change residuals.

In step 1110, a set of overlay values may be acquired at a plurality of points on the surface of the wafer at the additional process level, the set of overlay values associated with a misalignment produced between the first process level and the additional process level. In step 1112, a set of overlay residuals may be generated utilizing the acquired set of overlay values. In step 1114, a set of overlay residual metrics may be calculated utilizing the set of overlay residuals.

Figure 12:
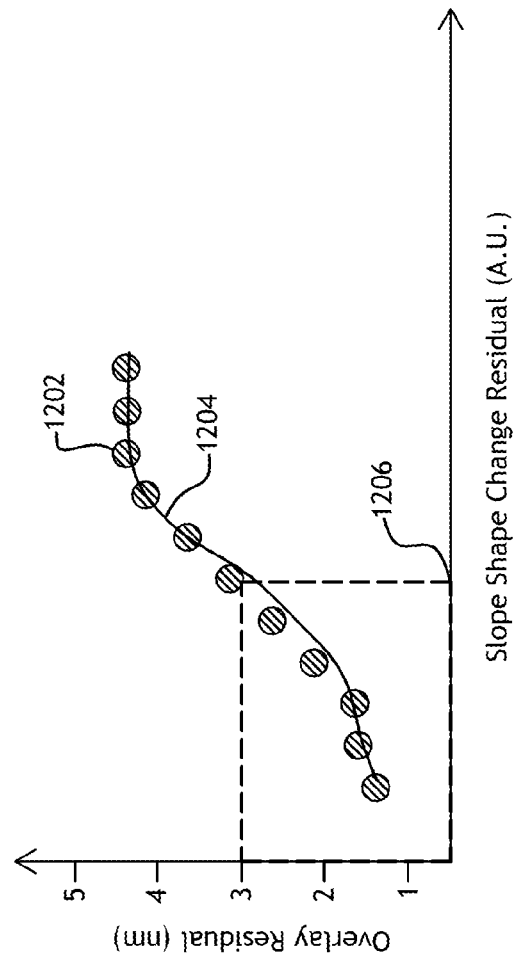
FIG. 12 illustrates an overlay residual and slope of shape change residual calibration curve, in accordance with the present invention.

In step 1116, a calibration curve may be generated by comparing the set of residual slope shape change metrics to the set of residual overlay metrics. FIG. 12 illustrates one such calibration curve, whereby overlay residuals obtained from a wafer are related to a set of wafer slope shape change residuals also obtained from the wafer. It is noted herein that the curve may consist of a known fitting function (e.g., polynomial expansion) fitted to the overlay residual metrics versus slope of shape change residual metrics data 1200. In this regard, the calibration curve allows the system 200 or user to determine the value of the wafer slope shape change residuals needed to attain a selected overlay residual value. In step 1118, a threshold may be determined for the set of residual slope shape change metrics suitable for maintaining residual overlay below a selected level based on the generated calibration curve. As shown in FIG. 12, the wafer slope of shape residual value needed to achieve an overlay residual value at or below 3 nm is demarked by line 1206. In a further embodiment, a plurality of wafers may be sorted by generating a set of residual slope shape change metrics for each of the wafers and comparing the acquired set of residual slope shape change metrics to the threshold determined above.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A method for providing a wafer geometry metric, comprising:
    acquiring a wafer shape value at each of a plurality of points of a surface of a wafer at a first process level and an additional process level;
    generating a wafer shape change value at each of the points utilizing the acquired wafer shape value at each of the points at the first process level and the additional process level, the wafer shape change value at each point corresponding to a change in wafer shape between the first process level and the second process level;
    generating a set of slope of shape change values by calculating a slope of shape change at each of the points utilizing the generated wafer shape change value at each of the points, each of the slope of shape change values corresponding to a slope of the change in wafer shape along at least one direction of the surface of the wafer;
    calculating a set of process tool correctables utilizing the generated set of slope of shape change values;
    generating a set of slope shape change residuals (SSCRs) by calculating a slope of shape change residual value at each of the points utilizing the set of process tool correctables;
    defining a plurality of metric analysis regions distributed across the surface of the wafer, each metric analysis region encompassing one or more points of the plurality of points; and
    generating one or more residual slope shape change metrics for each metric analysis region based on one or more SSCRs within each metric analysis region.

2. A method for providing a wafer geometry metric, comprising:
    acquiring a wafer shape value at each of a plurality of points of a surface of the wafer at a process level;
    generating a set of slope of shape values by calculating a slope of shape value at each of the points at the process level utilizing the wafer shape values acquired at the process level;
    calculating a set of process tool correctables utilizing the generated set of slope of shape values;
    generating a set of slope shape residuals (SSRs) by calculating a slope of shape residual value at each of the points utilizing the set of process tool correctables;
    defining a plurality of metric analysis regions distributed across the surface of the wafer, each metric analysis region encompassing one or more points of the plurality of points; and
    generating one or more residual slope shape metrics for each metric analysis region based on one or more SSRs within each metric analysis region.

3. The method of claim 2, wherein the calculated slope of shape value value at each of the points comprises:
    at least one of a front-side wafer surface shape slope or a back-side wafer surface shape slope.

4. The method of claim 2, further comprising:
    generating a global residual slope shape metric for the wafer utilizing the one or more residual slope shape change metrics for each metric analysis region.

5. The method of claim 2, wherein the generating one or more residual slope shape metrics for each metric analysis region based on one or more SSRs within each metric analysis region comprises:
    generating a residual slope shape mean metric for each metric analysis region based on one or more SSRs within each metric analysis region.

6. The method of claim 2, wherein the generating one or more residual slope shape metrics for each metric analysis region based on one or more SSRs within each metric analysis region comprises:
    generating a residual slope shape deviation metric for each metric analysis region based on one or more SSRs within each metric analysis region.

7. The method of claim 2, wherein the generating one or more residual slope shape metrics for each metric analysis region based on one or more SSRs within each metric analysis region comprises:
    generating a residual slope shape range metric for each metric analysis region based on one or more SSRs within each metric analysis region.

8. The method of claim 2, wherein the generating one or more residual slope shape metrics for each metric analysis region based on one or more SSRs within each metric analysis region comprises:
    generating a residual slope shape maximum metric for each metric analysis region based on one or more SSRs within each metric analysis region.

9. The method of claim 2, further comprising:
    generating one or more residual overlay metrics for each metric analysis region based on one or more residual overlay values within each metric analysis region.

10. The method of claim 2, wherein the calculating a set of process tool correctables utilizing the generated set of slope of shape values comprises:
    calculating at least one of a set of wafer-level process tool correctables utilizing the generated set of slope of shape values or a set of field-level process tool correctables utilizing the generated set of slope of shape values.

11. The method of claim 2, wherein the calculating a set of process tool correctables utilizing the generated set of slope of shape values comprises:
   calculating at least one of a set of linear process tool correctables utilizing the generated set of slope of shape values or a set of higher-order process tool correctables utilizing the generated set of slope of shape values.

12. A system for providing a wafer geometry metric, comprising:
   a topography system configured to perform a set of topography measurements in order to acquire a wafer shape value at each of a plurality of points of a surface of a wafer at a first process level and an additional process level; and
   one or more computing systems communicatively coupled to the topography and configured to receive the set of topography measurements, the one or more computing systems further configured to:
      generate a wafer shape change value at each of the points utilizing the acquired wafer shape value at each of the points at the first process level and the additional process level;
      generate a set of slope of shape change values by calculating a slope of shape change at each of the points utilizing the generated wafer shape change value at each of the points;
      calculating a set of process tool correctables utilizing the generated set of slope of shape change values;
      generating a set of slope shape change residuals (SSCRs) by calculating a slope of shape change residual value at each of the points utilizing the set of process tool correctables;
      defining a plurality of metric analysis regions distributed across the surface of the wafer; and
      generating one or more residual slope shape change metrics for each metric analysis region based on one or more SSCRs within each metric analysis region.

13. The system of claim 12, wherein the topography systems comprises:
   an interferometry based topography system.

14. The system of claim 13, wherein the interferometry based topography system comprises:
   a dual Fizeau interferometer.

15. The system of claim 12, wherein the topography system comprises:
   a topography system configured to measure a front-side surface of the wafer and the back-side surface of the wafer simultaneously.

16. The system of claim 12, wherein the generated wafer shape change value at each of the points comprises:
   at least one of a front-side wafer surface shape change or a back-side wafer surface shape change.

17. The system of claim 12, wherein the wafer shape value at each of a plurality of points of a surface of a wafer at a first process level and an additional process level comprises is acquired by:
   receiving a wafer in a substantially free state;
   performing a first set topographic measurements on the wafer at a first process level, wherein the first set of topographic measurements is configured to measure topography at each of a plurality of points of a surface of the wafer at the first process level; and
   performing an additional set of topographic measurements on the wafer at an additional process level, wherein the additional set of topographic measurements is configured to measure topography at each of the plurality of points of the surface at the additional process level.

18. The system of claim 12, wherein the generating a set of slope of shape change values by calculating a slope of shape change at each of the points utilizing the generated wafer shape change value at each of the points comprises:
   generating a slope of shape change value at each of the points by comparing a shape change value of each point to one or more shape change values associated with one or more points adjacent to each point.

19. The system of claim 12, wherein the defining a plurality of metric analysis regions distributed across the surface of the substrate:
   defining a plurality of metric analysis regions distributed across the surface of the substrate, each metric region having a geometric shape.

20. The system of claim 19, wherein the geometric shape comprises at least one of a radial band, a radial sector, or a rectangle.

21. The system of claim 12, wherein the defining a plurality of metric analysis regions distributed across the surface of the substrate:
   defining a plurality of metric analysis regions distributed across the surface of the substrate based on at least one of field dimension or die dimension.

22. The system of claim 12, wherein the one or more computing systems are further configured to:
   generate a global residual slope shape change metric for the wafer utilizing the one or more residual slope shape change metrics for each metric analysis region.

23. The system of claim 22, wherein the generating one or more residual slope shape change metrics for each metric analysis region based on one or more SSCRs within each metric analysis region comprises:
   generating a residual slope shape change mean metric for each metric analysis region based on one or more SSCRs within each metric analysis region.

24. The system of claim 12, wherein the generating one or more residual slope shape change metrics for each metric analysis region based on one or more SSCRs within each metric analysis region comprises:
   generating a residual slope shape change deviation metric for each metric analysis region based on one or more SSCRs within each metric analysis region.

25. The system of claim 12, wherein the generating one or more residual slope shape change metrics for each metric analysis region based on one or more SSCRs within each metric analysis region comprises:
   generating a residual slope shape change range metrics for each metric analysis region based on one or more SSCRs within each metric analysis region.

26. The system of claim 12, wherein the generating one or more residual slope shape change metrics for each metric analysis region based on one or more SSCRs within each metric analysis region comprises:
   generating a residual slope shape change maximum metric for each metric analysis region based on one or more SSCRs within each metric analysis region.

27. The system of claim 12, wherein the one or more computing systems are further configured to:
   generate one or more residual overlay metrics for each metric analysis region based on one or more residual overlay values within each metric analysis region.

28. The system of claim 27, wherein the one or more computing systems are further configured to:
   generate a global residual overlay metric for the wafer utilizing the one or more residual overlay metrics for each metric analysis region.

29. The system of claim 27, wherein the generating one or more residual overlay metrics for each metric analysis region based on one or more residual overlay values within each metric analysis region comprises:

generating one or more residual overlay mean metrics for each metric analysis region based on one or more residual overlay values within each metric analysis region.

30. The system of claim 27, wherein the generating one or more residual overlay metrics for each metric analysis region based on one or more residual overlay values within each metric analysis region comprises:

generating one or more residual overlay deviation metrics for each metric analysis region based on one or more residual overlay values within each metric analysis region.

31. The system of claim 27, wherein the generating one or more residual overlay metrics for each metric analysis region based on one or more residual overlay values within each metric analysis region comprises:

generating one or more residual overlay range metrics for each metric analysis region based on one or more residual overlay values within each metric analysis region.

32. The system of claim 27, wherein the generating one or more residual overlay metrics for each metric analysis region based on one or more residual overlay values within each metric analysis region comprises:

generating one or more residual overlay maximum metrics for each metric analysis region based on one or more residual overlay values within each metric analysis region.

33. The system of claim 12, wherein the one or more computing systems are further configured to:

generate a contour map of the generated the one or more residual slope shape change metrics as a function of position across the wafer.

34. The system of claim 33, wherein the one or more computing systems are further configured to:

identify one or more regions of excursion utilizing the contour map.

35. The system of claim 34, wherein the one or more computing systems are further configured to:

control one or more processes in the identified one or more regions of excursion.

36. The system of claim 12, wherein the calculating a set of process tool correctables utilizing the generated set of slope of shape change values comprises:

calculating at least one of a set of wafer-level process tool correctables utilizing the generated set of slope of shape change values or a set of field-level process tool correctables utilizing the generated set of slope of shape change values.

37. The system of claim 12, wherein the calculating a set of process tool correctables utilizing the generated set of slope of shape change values comprises:

calculating at least one of a set of linear process tool correctables utilizing the generated set of slope of shape change values or a set of higher-order process tool correctables utilizing the generated set of slope of shape change values.

* * * * *